(12) United States Patent
Sakata

(10) Patent No.: US 8,288,180 B2
(45) Date of Patent: Oct. 16, 2012

(54) METHOD FOR MANUFACTURING LIGHT EMITTING DEVICE

(75) Inventor: Junichiro Sakata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 361 days.

(21) Appl. No.: 11/455,254

(22) Filed: Jun. 16, 2006

(65) Prior Publication Data

US 2007/0000487 A1    Jan. 4, 2007

(30) Foreign Application Priority Data

Jul. 4, 2005   (JP) ................... 2005-194559

(51) Int. Cl.
*H01L 21/00* (2006.01)

(52) U.S. Cl. ............. 438/22; 438/28; 438/29; 438/34

(58) Field of Classification Search .......... 438/22, 438/28, 29, 34
See application file for complete search history.

(56) References Cited

U.S. PATENT DOCUMENTS

| | | | | |
|---|---|---|---|---|
| 6,013,384 | A | 1/2000 | Kido et al. | 428/690 |
| 6,215,244 | B1 | 4/2001 | Kuribayashi et al. | 313/505 |
| 6,583,557 | B2 * | 6/2003 | Hashimoto et al. | 313/506 |
| 6,589,673 | B1 | 7/2003 | Kido et al. | 428/690 |
| 6,620,528 | B1 * | 9/2003 | Yamazaki et al. | 428/690 |
| 6,794,278 | B2 | 9/2004 | Kido et al. | 438/584 |
| 6,846,380 | B2 * | 1/2005 | Dickinson et al. | 156/345.31 |
| 6,998,789 | B2 | 2/2006 | Uchida | |
| 7,247,074 | B2 | 7/2007 | Kato et al. | |
| 7,387,904 | B2 | 6/2008 | Saito et al. | |
| 7,449,724 | B2 | 11/2008 | Yamazaki et al. | |
| 2003/0117069 | A1 | 6/2003 | Kato et al. | |
| 2003/0189401 | A1 | 10/2003 | Kido et al. | 313/504 |
| 2004/0161192 | A1 | 8/2004 | Hamano et al. | 385/31 |
| 2005/0084712 | A1 | 4/2005 | Kido et al. | 428/690 |
| 2005/0084713 | A1 | 4/2005 | Kido et al. | 428/690 |
| 2005/0098207 | A1 | 5/2005 | Matsumoto et al. | |
| 2005/0106419 | A1 | 5/2005 | Endoh et al. | 428/690 |
| 2005/0214197 | A1 * | 9/2005 | Gu et al. | 423/447.3 |
| 2005/0233167 | A1 * | 10/2005 | Che et al. | 428/690 |
| 2005/0248267 | A1 | 11/2005 | Gyoutoku et al. | 313/506 |
| 2006/0008740 | A1 | 1/2006 | Kido et al. | 430/296 |

(Continued)

FOREIGN PATENT DOCUMENTS

EP    1 521 316 A2    4/2005

(Continued)

OTHER PUBLICATIONS

1) Tang, C.W. et al, "Organic Electroluminescent Diodes," Appl. Phys. Lett., vol. 51, No. 12, pp. 913-915, Sep. 21, (1987).

*Primary Examiner* — Jae Lee
(74) *Attorney, Agent, or Firm* — Husch Blackwell LLP

(57) ABSTRACT

An object of the present invention to improve reliability of a light emitting device having a mixed layer including an organic compound and metal oxide without reducing productivity. The above object is solved in such a way that after forming the mixed layer including the organic compound and metal oxide, the mixed layer is exposed to a nitrogen gas atmosphere without being exposed to a gas atmosphere including oxygen, and then a stacked film is formed over the mixed layer without exposing the mixed layer to a gas atmosphere including oxygen.

8 Claims, 23 Drawing Sheets

U.S. PATENT DOCUMENTS

| | | | | |
|---|---|---|---|---|
| 2006/0012295 A1* | 1/2006 | Kobayashi | | 313/506 |
| 2006/0158098 A1* | 7/2006 | Raychaudhuri et al. | | 313/503 |
| 2006/0232201 A1* | 10/2006 | Xu | | 313/506 |
| 2007/0170429 A1* | 7/2007 | Miyazawa | | 257/59 |
| 2008/0203385 A1 | 8/2008 | Saito et al. | | |

FOREIGN PATENT DOCUMENTS

| | | |
|---|---|---|
| EP | 1 530 245 A2 | 5/2005 |
| EP | 1 865 566 A1 | 12/2007 |
| EP | 2 276 088 A2 | 1/2011 |
| JP | 11-008065 | 1/1999 |
| JP | 2000-068068 | 3/2000 |
| JP | 2000-68068 | 3/2000 |
| JP | 2000-150169 | 5/2000 |
| JP | 2003-168565 | 6/2003 |
| JP | 2004-235048 | 8/2004 |
| JP | 2005-4062 | 1/2005 |
| JP | 2005-026121 | 1/2005 |
| JP | 2005-26121 | 1/2005 |
| JP | 2005-93402 | 4/2005 |
| JP | 2005-109469 | 4/2005 |
| JP | 2005-123095 | 5/2005 |
| JP | 2005-129500 | 5/2005 |
| JP | 2005-135600 | 5/2005 |
| JP | 2005-166637 | 6/2005 |
| JP | 2005-166641 | 6/2005 |
| JP | 2006-019375 | 1/2006 |
| WO | WO 2005/031798 A2 | 4/2005 |

* cited by examiner

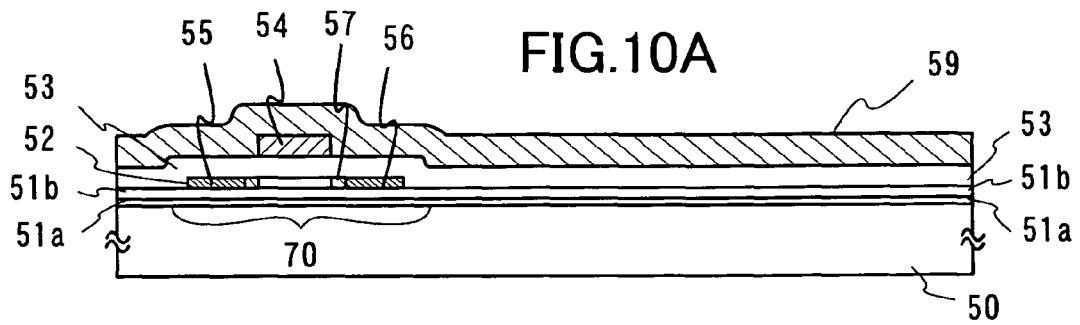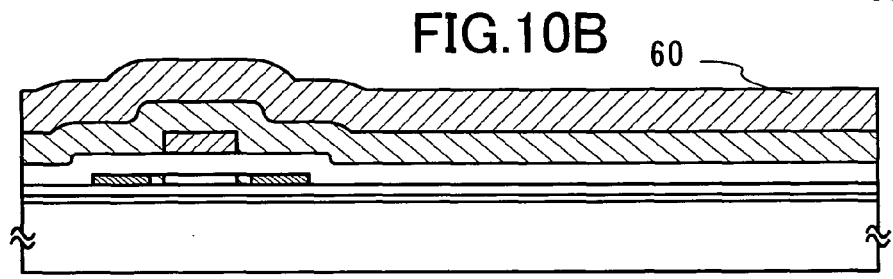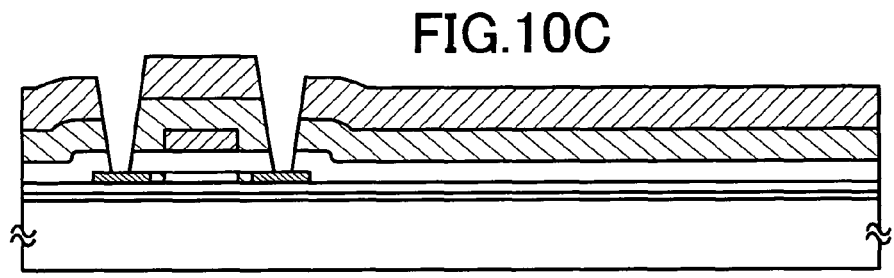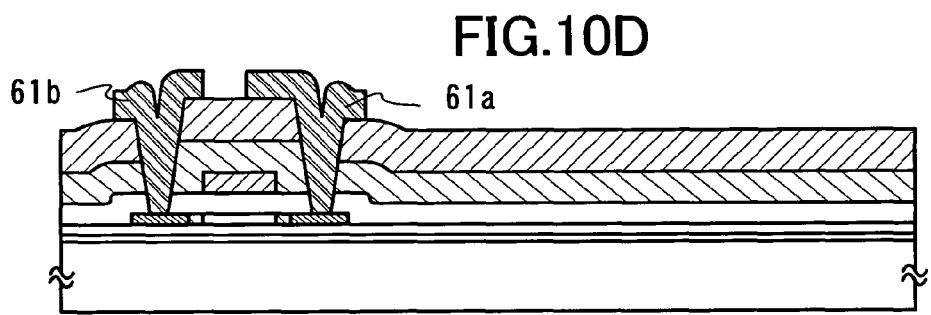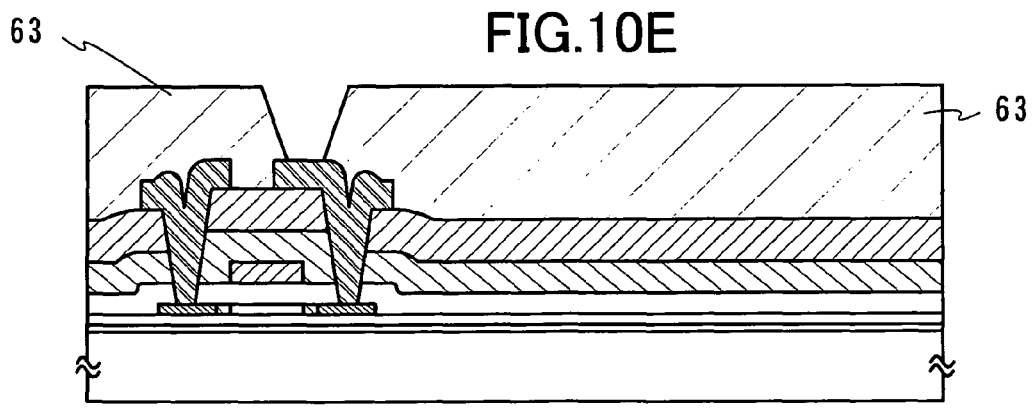

emission emission

METHOD FOR MANUFACTURING LIGHT EMITTING DEVICE

BACKGROUND OF THE INVENTION

1. Field of the Invention

The present invention relates to a method for manufacturing an electroluminescence light emitting device used for a planar light source or a display element (hereinafter, also referred to as a "light emitting device").

2. Description of the Related Art

An electroluminescence light emitting device has a light emitting layer formed using an organic compound and the like. Such an electroluminescence light emitting device is attracting attention for realizing a large-area display element at low driving voltage.

To improve efficiency of an element, Tang et al. proposed a structure in which organic compounds having different carrier transporting properties are stacked to inject holes and electrons from an anode electrode layer and a cathode electrode layer with good balance. Further, a thickness of an organic layer is set to be 200 nm or less to realize light emitting luminance of 1,000 $cd/m^2$ and external quantum efficiency of 1% at applied voltage of 10 V or less (for example, non-patent document 1).

In developing such a high-efficiency element, it has been recognized that a technique for injecting electrons from a cathode electrode layer or holes from an anode electrode layer to an organic layer without generating an energy barrier, is an essential element.

Kido et al. proposed that a hole injecting layer is formed by a mixed layer of metal oxide and an organic compound. According to Kido et al., this can reduce driving voltage of an element and drastically reduce risk of electrical short between a cathode electrode layer and an anode electrode layer by adjusting a thickness of the hole transporting layer without increasing driving voltage (patent document 1).

However, there has been a problem of shortening luminance half life in the above described structures (patent document 2).

[Non patent document 1]: Applied Physics Letter., 51, 913 (1987)

[Patent document 1]: Japanese Patent Application Laid-Open No. 2005-123095

[Patent document 2]: Japanese Patent Application Laid-Open No. 2005-166641

[Patent document 3]: Japanese Patent Application Laid-Open No. 2000-68068

[Patent document 4]: Japanese Patent Application Laid-Open No. Hei 11-8065

SUMMARY OF THE INVENTION

Accordingly, it is an object of the present invention to improve reliability of a light emitting device having a mixed layer including an organic compound and metal oxide without reducing productivity. The present invention solves the above described problem in such a way that after forming a mixed layer including an organic compound and metal oxide, the mixed layer is exposed to a nitrogen ($N_2$) gas atmosphere without being exposed to a gas atmosphere including oxygen, and then a stacked film is formed without exposing the mixed layer to a gas atmosphere including oxygen. The gas atmosphere including oxygen indicates a gas atmosphere including an oxygen atom such as oxygen gas, $NO_2$ gas, $N_2O$ gas or the like. After the formation of the mixed layer including the organic compound and metal oxide, by exposing the mixed layer to the nitrogen ($N_2$) gas atmosphere without being exposed to a gas atmosphere including oxygen, film quality and reliability are improved without reducing productivity.

In an aspect of the present invention, an anode is formed; a mixed layer including an organic compound and metal oxide is formed over the anode; the mixed layer is exposed to a nitrogen gas atmosphere without being exposed to a gas atmosphere including oxygen; a hole transporting layer is formed over the mixed layer without exposing the mixed layer to a gas atmosphere including oxygen; a light emitting layer is formed over the hole transporting layer; and a cathode is formed over the light emitting layer.

In another aspect of the present invention, an anode is formed; a first mixed layer including an organic compound and metal oxide is formed over the anode; the first mixed layer is exposed to a nitrogen gas atmosphere without being exposed to a gas atmosphere including oxygen; a second mixed layer including an organic compound and metal oxide is formed over the first mixed layer without exposing the first mixed layer to a gas atmosphere including oxygen; the second mixed layer is exposed to a nitrogen gas atmosphere without being exposed to a gas atmosphere including oxygen; a hole transporting layer is formed over the second mixed layer without exposing the second mixed layer to a gas atmosphere including oxygen; a light emitting layer is formed over the hole transporting layer; and a cathode is formed over the light emitting layer.

In another aspect of the present invention, an anode is formed; a hole transporting layer is formed over the anode; a light emitting layer is formed over the hole transporting layer; an electron transporting layer is formed over the light emitting layer; a mixed layer including an organic compound and metal oxide is formed over the electron transporting layer; the mixed layer is exposed to a nitrogen gas atmosphere without being exposed to a gas atmosphere including oxygen; and a cathode is formed over the mixed layer without exposing the mixed layer to a gas atmosphere including oxygen.

In another aspect of the present invention, an anode is formed; a hole transporting layer is formed over the anode; a light emitting layer is formed over the hole transporting layer; an electron transporting layer is formed over the light emitting layer; a first mixed layer including an organic compound and metal oxide is formed over the electron transporting layer; the first mixed layer is exposed to a nitrogen gas atmosphere without being exposed to a gas atmosphere including oxygen; a second mixed layer including an organic compound and metal oxide is formed over the first mixed layer without exposing the first mixed layer to a gas atmosphere including oxygen; the second mixed layer is exposed to a nitrogen gas atmosphere without being exposed to a gas atmosphere including oxygen; and a cathode is formed over the second mixed layer without exposing the second mixed layer to a gas atmosphere including oxygen.

The anode, the hole transporting layer, the light emitting layer, the mixed layer, the first mixed layer, the second mixed layer, the electron transporting layer, and the cathode are desirably formed in vacuum or under reduced pressure.

The mixed layer may be formed after the anode is subjected to heat treatment. The heat treatment is desirably performed in vacuum or under reduced pressure.

An electron injecting layer may be formed between the mixed layer and the electron transporting layer. The electron injecting layer is desirably formed in vacuum or under reduced pressure.

After the mixed layer, the first mixed layer, and the second mixed layer are exposed to a nitrogen gas atmosphere, the nitrogen gas may be evacuated, and then they may be exposed to a nitrogen gas atmosphere again.

The mixed layer, the first mixed layer, and the second mixed layer may be sprayed with nitrogen gas so as to be exposed to a nitrogen gas atmosphere.

In another aspect of the present invention, a cathode is formed; a mixed layer including an organic compound and metal oxide is formed over the cathode; the mixed layer is exposed to a nitrogen gas atmosphere without being exposed to a gas atmosphere including oxygen; an electron transporting layer is formed over the mixed layer without exposing the mixed layer to a gas atmosphere including oxygen; a light emitting layer is formed over the electron transporting layer; and an anode is formed over the light emitting layer.

In another aspect of the present invention, a cathode is formed; a first mixed layer including an organic compound and metal oxide is formed over the cathode; the first mixed layer is exposed to a nitrogen gas atmosphere without being exposed to a gas atmosphere including oxygen; a second mixed layer including an organic compound and metal oxide is formed over the first mixed layer without exposing the first mixed layer to a gas atmosphere including oxygen; the second mixed layer is exposed to a nitrogen gas atmosphere without being exposed to a gas atmosphere including oxygen; an electron transporting layer is formed over the second mixed layer without exposing the second mixed layer to a gas atmosphere including oxygen; a light emitting layer is formed over the electron transporting layer; a hole transporting layer is formed over the light emitting layer; and an anode is formed over the hole transporting layer.

In another aspect of the present invention, a cathode is formed; a mixed layer including an organic compound and metal oxide is formed over the cathode; the mixed layer is exposed to a nitrogen gas atmosphere without being exposed to a gas atmosphere including oxygen; an electron injecting layer is formed over the mixed layer without exposing the mixed layer to a gas atmosphere including oxygen; an electron transporting layer is formed over the electron injecting layer; a light emitting layer is formed over the electron transporting layer; a hole transporting layer is formed over the light emitting layer; and an anode is formed over the hole transporting layer.

In another aspect of the present invention, a cathode is formed; a first mixed layer including an organic compound and metal oxide is formed over the cathode; the first mixed layer is exposed to a nitrogen gas atmosphere without being exposed to a gas atmosphere including oxygen; a second mixed layer including an organic compound and metal oxide is formed over the first mixed layer without exposing the first mixed layer to a gas atmosphere including oxygen; the second mixed layer is exposed to a nitrogen gas atmosphere without being exposed to a gas atmosphere including oxygen; an electron injecting layer is formed over the second mixed layer without exposing the second mixed layer to a gas atmosphere including oxygen; an electron transporting layer is formed over the electron injecting layer; a light emitting layer is formed over the electron transporting layer; and an anode is formed over the light emitting layer.

In another aspect of the present invention, a cathode is formed; an electron transporting layer is formed over the cathode; a light emitting layer is formed over the electron transporting layer; a hole transporting layer is formed over the light emitting layer; a mixed layer including an organic compound and metal oxide is formed over the hole transporting layer; the mixed layer is exposed to a nitrogen gas atmosphere without being exposed to a gas atmosphere including oxygen; and an anode is formed over the mixed layer without exposing the mixed layer to a gas atmosphere including oxygen.

In another aspect of the present invention, a cathode is formed; an electron transporting layer is formed over the cathode; a light emitting layer is formed over the electron transporting layer; a hole transporting layer is formed over the light emitting layer; a first mixed layer including an organic compound and metal oxide is formed over the hole transporting layer; the first mixed layer is exposed to a nitrogen gas atmosphere without being exposed to a gas atmosphere including oxygen; a second mixed layer including an organic compound and metal oxide is formed over the first mixed layer without exposing the first mixed layer to a gas atmosphere including oxygen; the second mixed layer is exposed to a nitrogen gas atmosphere without being exposed to a gas atmosphere including oxygen; and an anode is formed over the second mixed layer without exposing the second mixed layer to a gas atmosphere including oxygen.

The anode, the hole transporting layer, the light emitting layer, the mixed layer, the first mixed layer, the second mixed layer, the electron transporting layer, the electron injecting layer, and the cathode are desirably formed in vacuum or under reduced pressure.

After the mixed layer, the first mixed layer, and the second mixed layer are exposed to a nitrogen gas atmosphere, the nitrogen gas may be evacuated, and then they may be exposed to a nitrogen gas atmosphere again.

The mixed layer, the first mixed layer, and the second mixed layer may be sprayed with the nitrogen gas so as to be exposed to a nitrogen gas atmosphere.

In another aspect of the present invention, an anode is formed; a first mixed layer including an organic compound and metal oxide is formed over the anode; the first mixed layer is exposed to a nitrogen gas atmosphere without being exposed to a gas atmosphere including oxygen; a hole transporting layer is formed over the first mixed layer without exposing the first mixed layer to a gas atmosphere including oxygen; a light emitting layer is formed over the hole transporting layer; an electron transporting layer is formed over the light emitting layer; a second mixed layer including an organic compound and metal oxide is formed over the electron transporting layer; the second mixed layer is exposed to a nitrogen gas atmosphere without being exposed to a gas atmosphere including oxygen; and a cathode is formed over the second mixed layer without exposing the second mixed layer to a gas atmosphere including oxygen.

The first mixed layer may be formed after the anode is subjected to heat treatment. The heat treatment is desirably performed in vacuum or under reduced pressure.

An electron injecting layer may be formed between the second mixed layer and the electron transporting layer.

The anode, the hole transporting layer, the light emitting layer, the mixed layer, the first mixed layer, the second mixed layer, the electron transporting layer, the electron injecting layer, and the cathode are desirably formed in vacuum or under reduced pressure.

In another aspect of the present invention, a cathode is formed; a first mixed layer including an organic compound and metal oxide is formed over the cathode; the first mixed layer is exposed to a nitrogen gas atmosphere without being exposed to a gas atmosphere including oxygen; an electron transporting layer is formed over the first mixed layer without exposing the first mixed layer to a gas atmosphere including oxygen; a light emitting layer is formed over the electron transporting layer; a hole transporting layer is formed over the light emitting layer; a second mixed layer including an organic compound and metal oxide is formed over the hole transporting layer; the second mixed layer is exposed to a nitrogen gas atmosphere without being exposed to a gas atmosphere including oxygen; and an anode is formed over the second mixed layer without exposing the second mixed layer to a gas atmosphere including oxygen.

In another aspect of the present invention, a cathode is formed; a first mixed layer including an organic compound and metal oxide is formed over the cathode; the first mixed layer is exposed to a nitrogen gas atmosphere without being exposed to a gas atmosphere including oxygen; an electron injecting layer is formed over the first mixed layer without exposing the first mixed layer to a gas atmosphere including oxygen; an electron transporting layer is formed over the electron injecting layer; a light emitting layer is formed over the electron transporting layer; a hole transporting layer is formed over the light emitting layer; a second mixed layer including an organic compound and metal oxide is formed over the hole transporting layer; the second mixed layer is exposed to a nitrogen gas atmosphere without being exposed to a gas atmosphere including oxygen; and an anode is formed over the second mixed layer without exposing the second mixed layer to a gas atmosphere including oxygen.

After the first mixed layer is exposed to the nitrogen gas atmosphere, the nitrogen gas may be evacuated, and then the first mixed layer may be exposed to a nitrogen gas atmosphere again. After the second mixed layer is exposed to the nitrogen gas atmosphere, the nitrogen gas may be evacuated, and then the second mixed layer may be exposed to a nitrogen gas atmosphere again.

The first mixed layer and the second mixed layer may be sprayed with the nitrogen gas so as to be exposed to the nitrogen gas atmosphere.

The anode, the hole transporting layer, the light emitting layer, the mixed layer, the first mixed layer, the second mixed layer, the electron transporting layer, the electron injecting layer, and the cathode are desirably formed in vacuum or under reduced pressure.

The first mixed layer may be formed by stacking a third mixed layer including an organic compound and metal oxide and a fourth mixed layer including an organic compound and metal oxide. Further, the second mixed layer may be formed by stacking a fifth mixed layer including an organic compound and metal oxide and a sixth mixed layer including an organic compound and metal oxide.

In this case, the third mixed layer may be formed and the third mixed layer may be exposed to a nitrogen gas atmosphere without being exposed to a gas atmosphere including oxygen. Subsequently, the fourth mixed layer may be formed without exposing the third mixed layer to a gas atmosphere including oxygen, the fourth mixed layer may be exposed to a nitrogen gas atmosphere without being exposed to a gas atmosphere including oxygen, and then a subsequent layer may be formed without exposing the third mixed layer to a gas atmosphere including oxygen.

Further, the fifth mixed layer may be formed and the fifth mixed layer may be exposed to a nitrogen gas atmosphere without being exposed to a gas atmosphere including oxygen. Subsequently, the sixth mixed layer may be formed without exposing the fifth mixed layer to a gas atmosphere including oxygen, the sixth mixed layer may be exposed to a nitrogen gas atmosphere without being exposed to a gas atmosphere including oxygen, and then a subsequent layer may be formed without exposing the sixth mixed layer to a gas atmosphere including oxygen.

After the third mixed layer is exposed to the nitrogen gas atmosphere, the nitrogen gas may be evacuated, and then the third mixed layer may be exposed to a nitrogen gas atmosphere again. After the fourth mixed layer is exposed to the nitrogen gas atmosphere, the nitrogen gas may be evacuated, and then the fourth mixed layer may be exposed to a nitrogen gas atmosphere again.

After the fifth mixed layer is exposed to the nitrogen gas atmosphere, the nitrogen gas may be evacuated, and then the fifth mixed layer may be exposed to a nitrogen gas atmosphere again. After the sixth mixed layer is exposed to the nitrogen gas atmosphere, the nitrogen gas may be evacuated, and then the sixth mixed layer may be exposed to a nitrogen gas atmosphere again.

The third mixed layer and the fourth mixed layer may be sprayed with nitrogen gas so as to be exposed to a nitrogen gas atmosphere.

The fifth mixed layer and the sixth mixed layer may be sprayed with nitrogen gas so as to be exposed to a nitrogen gas atmosphere.

In another aspect of the present invention, an anode is formed; a first light emitting unit including a light emitting layer is formed over the anode; a layer including a substance having an electron donating property and a substance having an electron transporting property is formed over the first light emitting unit; a mixed layer including an organic compound and metal oxide is formed over the layer including the substance having the electron donating property and the substance having the electron transporting property; the mixed layer is exposed to a nitrogen gas atmosphere without being exposed to a gas atmosphere including oxygen; a second light emitting unit is formed over the mixed layer without exposing the mixed layer to a gas atmosphere including oxygen; and a cathode is formed over the second light emitting unit.

In another aspect of the present invention, an anode is formed; a first light emitting unit including a light emitting layer is formed over the anode; a layer including a substance having an electron donating property and a substance having an electron transporting property is formed over the first light emitting unit; a first mixed layer including an organic compound and metal oxide is formed over the layer including the substance having the electron donating property and the substance having the electron transporting property; the first mixed layer is exposed to a nitrogen gas atmosphere without being exposed to a gas atmosphere including oxygen; a second mixed layer is formed over the first mixed layer without exposing the first mixed layer to a gas atmosphere including oxygen; the second mixed layer is exposed to a nitrogen gas atmosphere without being exposed to a gas atmosphere including oxygen; a second light emitting unit is formed over the second mixed layer without exposing the second mixed layer to a gas atmosphere including oxygen; and a cathode is formed over the second light emitting unit.

In another aspect of the present invention, a cathode is formed; a first light emitting unit including a light emitting layer is formed over the cathode; a layer including a substance having an electron donating property and a substance having an electron transporting property is formed over the first light emitting unit; a mixed layer including an organic compound and metal oxide is formed over the layer including the substance having the electron donating property and the substance having the electron transporting property; the mixed layer is exposed to a nitrogen gas atmosphere without being exposed to a gas atmosphere including oxygen; a second light emitting unit is formed over the mixed layer without exposing the mixed layer to a gas atmosphere including oxygen; and an anode is formed over the second light emitting unit.

In another aspect of the present invention, a cathode is formed; a first light emitting unit including a light emitting layer is formed over the cathode; a layer including a substance having an electron donating property and a substance having an electron transporting property is formed over the first light emitting unit; a first mixed layer including an organic compound and metal oxide is formed over the layer including the substance having the electron donating property and the substance having the electron transporting property; the first mixed layer is exposed to a nitrogen gas atmosphere without being exposed to a gas atmosphere including oxygen; a second mixed layer is formed over the first mixed layer without exposing the first mixed layer to a gas atmosphere including oxygen; the second mixed layer is exposed to a nitrogen gas atmosphere without being exposed to a gas atmosphere including oxygen; a second light emitting unit is formed over the second mixed layer without exposing the second mixed layer to a gas atmosphere including oxygen; and an anode is formed over the second light emitting unit.

After the mixed layer is exposed to a nitrogen gas atmosphere, the nitrogen gas may be evacuated, and then it may be exposed to a nitrogen gas atmosphere again.

The mixed layer may be sprayed with the nitrogen gas so as to be exposed to a nitrogen gas atmosphere.

After the anode is subjected to heat treatment, the light emitting units may be formed. The heat treatment is desirably performed in vacuum or under reduced pressure.

Each light emitting unit includes the light emitting layer. An electron transporting layer and a hole transporting layer may be formed in the light emitting unit. Further, an electron injecting layer may be formed between the cathode and the electron transporting layer. A hole injecting layer may be formed between the anode and the hole transporting layer.

After the first mixed layer and the second mixed layer are exposed to the nitrogen gas atmosphere, the nitrogen gas may be evacuated, and then they may be exposed to a nitrogen gas atmosphere again.

The first mixed layer and the second mixed layer may be sprayed with nitrogen gas so as to be exposed to a nitrogen gas atmosphere.

The anode, the light emitting unit, the mixed layer, the first mixed layer, the second mixed layer, and the cathode are desirably formed in vacuum or under reduced pressure.

When treatment for exposing to the nitrogen gas atmosphere is performed, it is preferably performed at a room temperature without heating. When heating, a characteristic is easily changed so that it is thought that a characteristic of a light emitting device is easily varied. Further, the amount of moisture contained in the nitrogen gas is set to be 40 ppm or less, and preferably, 3 ppm or less.

Ogawa et al. proposed a technique in which after forming a CuPc organic film having a hole injecting property, the CuPc organic film is subjected to first gas rinse treatment with $N_2$ gas, and then second gas rinse treatment is performed with $NO_2$ gas such that the $NO_2$ gas permeates the CuPc organic film (the patent document 3). In the present invention, however, after forming the mixed layer, the mixed layer is exposed to the nitrogen gas atmosphere without being exposed to a gas atmosphere including oxygen, and then a stacked film is formed without being exposed to a gas atmosphere including oxygen. Therefore, the present invention is completely different from the patent document 3 in which the first gas rinse treatment is performed with the $N_2$ gas and then the organic film is exposed to a gas atmosphere including oxygen.

Further, Kuribayashi et al. proposed a technique in which when organic electroluminescences, which emit light with three primary colors, are formed over the same substrate, the organic electroluminescences can be manufactured in vacuum, in a reduced pressure space, or under a dry nitrogen atmosphere without being exposed to atmospheric air throughout all process (the patent document 4). However, Kuribayashi et al. also disclosed that a stacked body including a hole injecting layer, a light emitting layer, and an $Alq_3$ layer is formed in vacuum or in a reduced pressure space without being exposed to atmospheric air, and then after forming a counter electrode, treatment is performed under the dry nitrogen atmosphere. However, in the patent document 4, it has not been disclosed that after forming a mixed layer, the mixed layer is exposed to a nitrogen gas atmosphere without being exposed to a gas atmosphere including oxygen, and then a subsequent stacked film is formed without exposing the mixed layer to a gas atmosphere including oxygen.

When after forming a mixed layer, the mixed layer is exposed to a nitrogen gas atmosphere without being exposed to a gas atmosphere including oxygen and a subsequent stacked film is formed without exposing the mixed layer to a gas atmosphere including oxygen, life of light emitting luminance can be improved without reducing productivity and deteriorating a characteristic of a light emitting device.

BRIEF DESCRIPTION OF DRAWINGS

FIGS. 10A to 10E are cross sectional views explaining a method for manufacturing a light emitting device of the present invention;

DETAILED DESCRIPTION OF THE INVENTION

Embodiment Modes

The embodiment modes of the present invention will be described below with reference to the accompanying drawings. It is easily understood by those skilled in the art that the embodiment modes and details herein disclosed can be modified in various ways without departing from the purpose and the scope of the invention. The present invention should not be interpreted as being limited to the description of the embodiment modes to be given below.

Embodiment Mode 1

In a method for manufacturing a light emitting device including an anode, a cathode, a light emitting layer provided between the anode and the cathode, and a mixed layer including an organic compound and metal oxide provided between the anode and the light emitting layer, this embodiment mode will explain treatment in which the mixed layer is exposed to a nitrogen gas atmosphere after formation of the mixed layer.

Figure 1A:
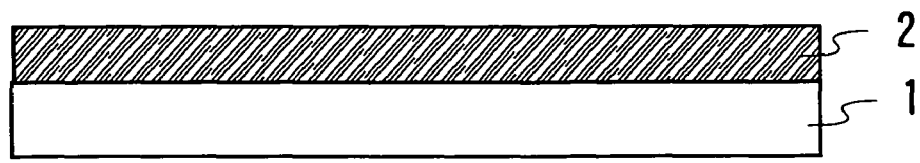
FIGS. 1A to 1D are cross sectional views explaining a method for manufacturing a light emitting device of the present invention.

An anode 2 is formed over a substrate 1 to have a thickness of 10 to 1,000 nm (FIG. 1A). As the substrate 1, quartz, glass, plastic, or the like can be used, for example. Further, other material may be used as the substrate 1 so long as it can serve as a supporting body in a process of manufacturing the light emitting device.

The anode 2 has a function of injecting holes to the light emitting layer. The anode 2 can be formed by using various kinds of metal; an alloy; an electroconductive compound; or a metal mixture thereof. For example, metal having a conductive property such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), and titanium (Ti); an alloy thereof such as aluminum-silicon (Al—Si), aluminum-titanium (Al—Ti), and aluminum-silicon-copper (Al—Si—Cu); nitride of a metal material such as titanium nitride (TiN); a metal compound such as ITO (indium tin oxide), ITO containing silicon oxide (ITSO), and IZO (indium zinc oxide) in which zinc oxide (ZnO) is mixed in indium oxide; or the like can be used.

The anode 2 is generally formed using a material having a high work function (e.g., 4.0 eV or more) so as to be able to inject holes. In the present invention, however, since a mixed layer 3 is formed on the anode 2, the anode 2 is not limited to a material having a high work function, and a material having a low work function can be used.

After forming a film using the above mentioned material over the substrate 1 by sputtering or CVD, the film is subjected to photolithography and etching to form the anode 2.

Figure 1B:
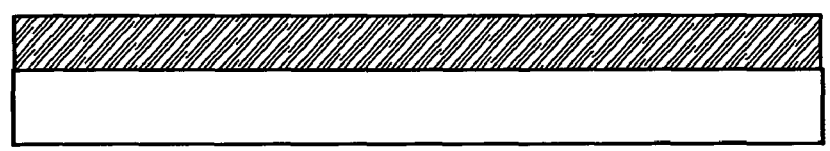

Prior to forming the mixed layer 3, heat treatment is performed here to remove moisture contained in the substrate 1 and the anode 2 (FIG. 1B). For example, the heat treatment can be carried out at 100 to 200° C., e.g., 150° C., in vacuum or under reduced pressure. After this heat treatment, each layer is preferably formed in vacuum or under reduced pressure without being exposed to atmospheric air.

Figure 1C:
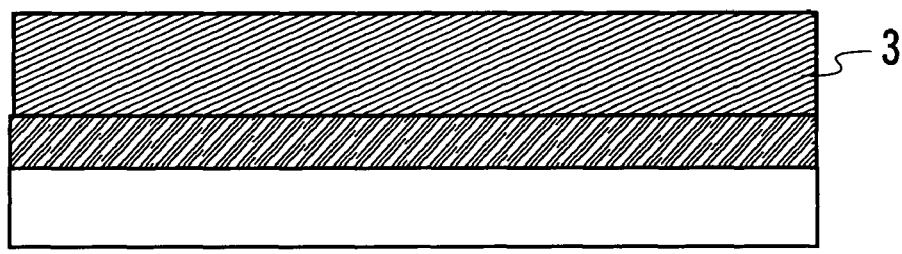

Next, the mixed layer 3 including an organic compound and metal oxide is formed in vacuum or under reduced pressure (FIG. 1C). This can prevent short-circuiting between the anode 2 and a cathode 7 due to concavity and convexity formed on the surface of the anode 2 or an extraneous material left on the surface of each electrode. The thickness of the mixed layer 3 is desirably 60 nm or more. More preferably, the thickness of the mixed layer 3 is 120 nm or more. Even when the thickness of the mixed layer 3 is increased, driving voltage of the light emitting device is not increased. Further, increasing the thickness of the mixed layer does not increase power consumption.

As the metal oxide, oxide or nitride of transition metal is desirable. Specifically, zirconium oxide, hafnium oxide, vanadium oxide, niobium oxide, tantalum oxide, chromium oxide, molybdenum oxide, tungsten oxide, titanium oxide, manganese oxide, or rhenium oxide is preferable.

An the organic compound, an organic material having an arylamine group such as 4,4'-bis[N-(1-naphthyl)-N-phenylamino]biphenyl (abbreviation: NPB), 4,4'-bis[N-(3-methylphenyl)-N-phenylamino]biphenyl (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis N-[4-(N,N-di-m-tolylamino)phenyl]-N-phenylaminobiphenyl (abbreviation: DNTPD), 1,3,5-tris[N,N-di(m-tolyl) amino]benzene (abbreviation: m-MTDAB), or 4,4',4"-tris(N-carbazolyl)triphenylamine (abbreviation: TCTA); phthalocyanine (abbreviation: H₂Pc); copper phthalocyanine (abbreviation: CuPc); vanadylphthalocyanine (abbreviation: VOPc); or the like can be used.

Further, an organic material represented by the following general formula (1) can be preferably used. As specific examples of such an organic material, 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and the like can be given. An organic compound having the structure is superior in heat stability and has preferable reliability.

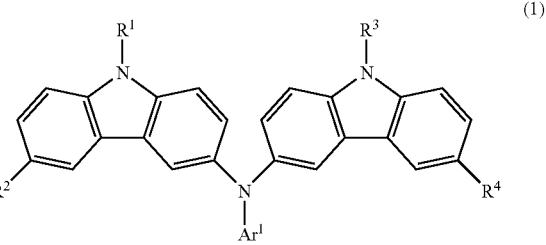

(1)

(In the general formula (1), $R^1$ and $R^3$ may be may be identical to or different from each other, and independently represent any of hydrogen, an alkyl group having 1 to 6 carbon atoms, an aryl group having 6 to 25 carbon atoms, a heteroaryl group having 5 to 9 carbon atoms, an arylalkyl group, and an acyl group having 1 to 7 carbon atoms. $Ar^1$ represents either an aryl group having 6 to 25 carbon atoms or a heteroaryl group having 5 to 9 carbon atoms. $R^2$ represents any one of hydrogen, an alkyl group having 1 to 6 carbon atoms, and an aryl group having 6 to 12 carbon atoms. $R^4$ represents any one of hydrogen, an alkyl group having 1 to 6 carbon atoms, an aryl group having 6 to 12 carbon atoms, and a substituent represented by the following general formula (2). In the substituent represented by the general formula (2), $R^5$ represents any one of hydrogen, an alkyl group having 1 to 6 carbon atoms, an aryl group having 6 to 25 carbon atoms, a heteroaryl group having 5 to 9 carbon atoms, an arylalkyl group, and an acyl group having 1 to 7 carbon atoms. $Ar^2$ represents either an aryl group having 6 to 25 carbon atoms or a heteroaryl group having 5 to 9 carbon atoms. $R^6$ represents any one of hydrogen, an alkyl group having 1 to 6 carbon atoms, and an aryl group having 6 to 12 carbon atoms.)

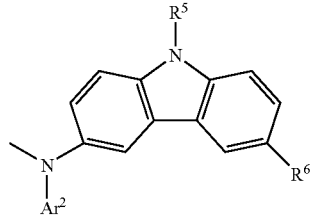

(2)

As a method for synthesizing a carbazole derivative, various reactions are applicable. For example, methods shown in the following reaction scheme (A-1) and reaction scheme (A-2) can be given. However, the method for synthesizing a carbazole derivative is not limited thereto.

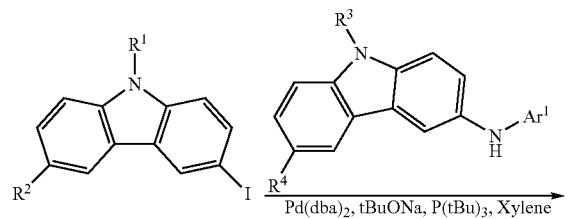

(A-1)

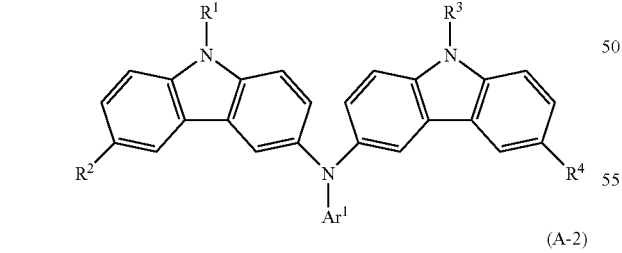

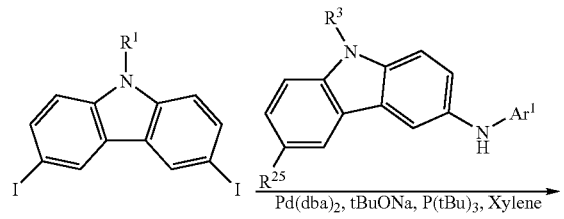

(A-2)

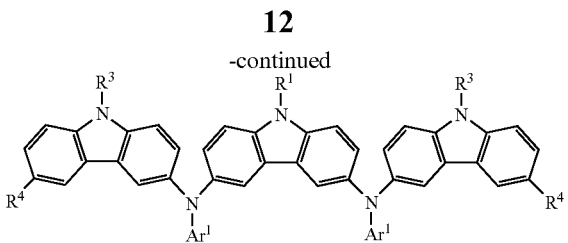

Further, an organic material represented by any one of the following general formulas (3) to (6) can be preferably used. As specific examples of an organic compound represented by any one of the following general formulas (3) to (6), N-(2-naphthyl)carbazole (abbreviation: NCz); 4,4'-di(N-carbazolyl)biphenyl (abbreviation: CBP); 9,10-bis[4-(N-carbazolyl)phenyl]anthracene (abbreviation: BCPA); 3,5-bis[4-(N-carbazolyl)phenyl]biphenyl (abbreviation: BCPBi); 1,3,5-tris[4-(N-carbazolyl)phenyl]benzene (abbreviation: TCPB); and the like can be given.

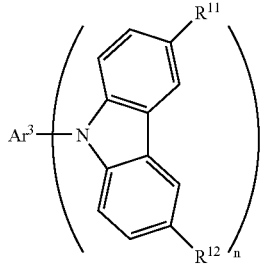

(3)

In the general formula (3), $Ar^3$ represents an aromatic hydrocarbon group having 6 to 42 carbon atoms, n represents a natural number of 1 to 3, and $R^{11}$ and $R^{12}$ independently represent any of hydrogen, an alkyl group having 1 to 4 carbon atoms, and an aryl group having 6 to 12 carbon atoms.

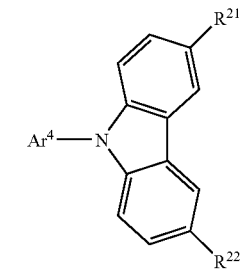

(4)

Note that in the general formula (4), $Ar^4$ represents a univalent aromatic hydrocarbon group having 6 to 42 carbon atoms, and $R^{21}$ and $R^{22}$ independently represent any of hydrogen, an alkyl group having 1 to 4 carbon atoms, and an aryl group having 6 to 12 carbon atoms.

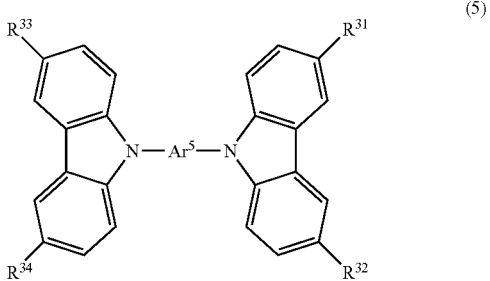

(5)

Note that in the general formula (5), Ar$^5$ represents a bivalent aromatic hydrocarbon group having 6 to 42 carbon atoms, and R$^{31}$ to R$^{34}$ independently represent any one of hydrogen, an alkyl group having 1 to 4 carbon atoms, and an aryl group having 6 to 12 carbon atoms.

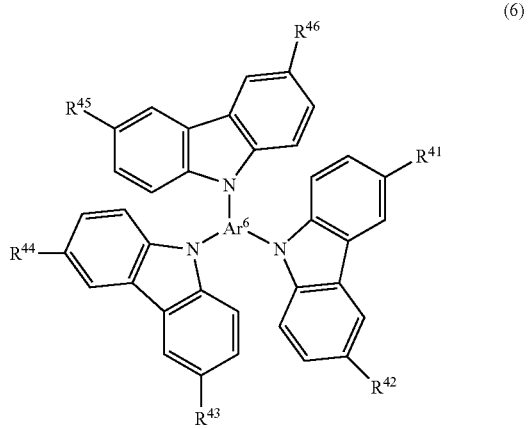

(6)

Note that in the general formula (6), Ar$^6$ represents a trivalent aromatic hydrocarbon group having 6 to 42 carbon atoms, and R$^{41}$ to R$^{46}$ independently represent any of hydrogen, an alkyl group having 1 to 4 carbon atoms, and an aryl group having 6 to 12 carbon atoms.

Aromatic hydrocarbon such as anthracene, 9,10-diphenylanthracene (abbreviation: DPA), 2-tert-butyl-9,10-di(2-naphthyl)anthracene (abbreviation: t-BuDNA); tetracene, rubrene, and pentacene can be used.

A compound with large steric hindrance may be added to the mixed layer 3 by co-evaporation or the like. This can prevent crystallization of the mixed layer 3. As the compound with large steric hindrance (i.e., having a structure with spatial spread, which is different from a planar structure), 5,6,11,12-tetraphenyltetracene (abbreviation: rubrene) is preferable. Note that in addition to that, hexaphenylbenzene, diphenylanthracene, t-butylperylene, 9,10-di(phenyl)anthracene, coumarin 545T, or the like may be used. In addition, dendrimer, and the like can be used.

The mixed layer 3 can be formed by co-evaporation of the above described metal oxide and organic compound. Further, it can also be formed by a wet method, a droplet discharging method, or the like. Note that in a case of forming the mixed layer 3, it is necessary to prevent the mixed layer from being exposed to a gas atmosphere including oxygen. When the mixed layer 3 is formed by evaporation, a pattern is formed by providing a mask made from metal or the like between an evaporation source and the substrate. Note that in the mixed layer 3, a weight ratio between the organic compound and the metal oxide is desirably set to be 95:5 to 20:80, and more preferably, 90:10 to 50:50.

Figure 1D:
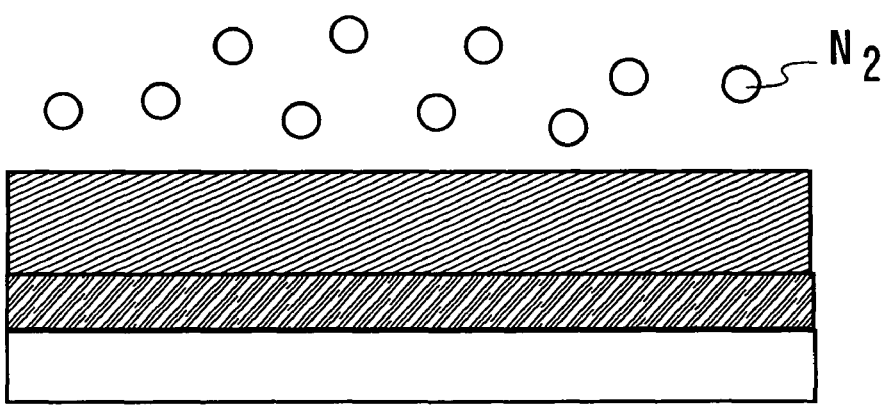

Next, the mixed layer 3 is exposed to a nitrogen gas atmosphere at a room temperature without heating and without being exposed to a gas atmosphere including oxygen (FIG. 1D). In FIG. 1D, nitrogen ($N_2$) is schematically shown by circles. In FIG. 3B, FIGS. 5A and 5B, FIGS. 6A and 6B, and FIG. 8B, nitrogen ($N_2$) is also schematically shown by circles. Nitrogen gas is introduced in a chamber in which the substrate 1 over which the mixed layer 3 is formed is set. Moisture is desirably removed from the nitrogen gas as much as possible, and the amount of moisture contained in the nitrogen gas is set to be 40 ppm or less, and preferably, 3 ppm or less. The nitrogen gas is introduced in the chamber at a flow rate of 1 to 500 sccm such that pressure inside the chamber becomes $1\times10^{-1}$ to $1\times10^6$ Pa. While maintaining the pressure inside the chamber, the substrate 1 is left for 1 to 24 hours such that the mixed layer 3 is exposed to the nitrogen gas atmosphere. Alternatively, the mixed layer 3 may be sprayed with the nitrogen gas. In this case, the substrate 1 is not necessary to be left for 1 to 24 hours, and the nitrogen gas may be sprayed for 10 to 180 minutes. After the mixed layer 3 is exposed to the nitrogen gas atmosphere, the nitrogen gas inside the chamber may be removed to made a vacuum state or a reduced pressure state, and then the mixed layer 3 may be exposed to a nitrogen gas atmosphere again as described above. This can prolong the life of the light emitting device.

Figure 2A:
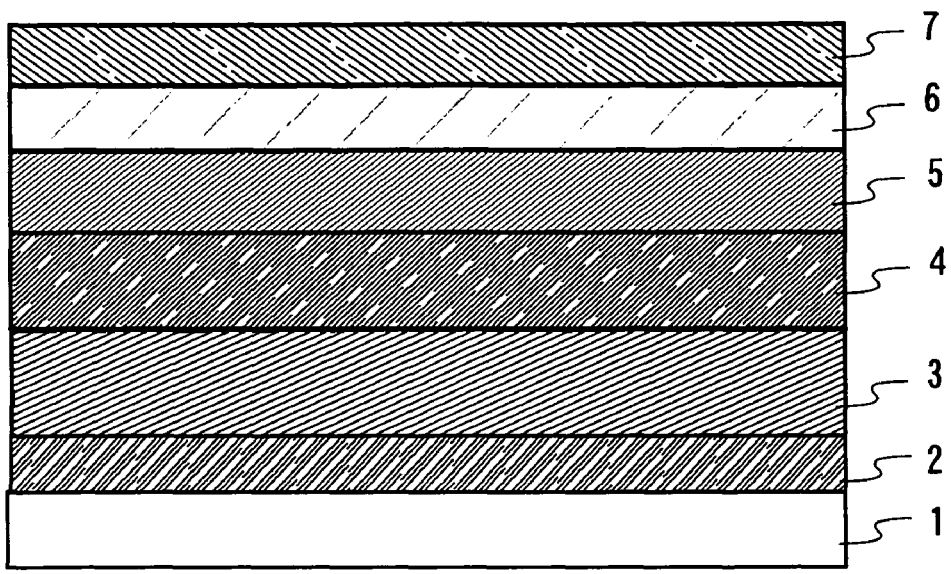
FIGS. 2A and 2B are cross sectional views explaining a method for manufacturing a light emitting device of the present invention.

Next, a hole transporting layer 4 is formed to have a thickness of 5 to 50 nm in vacuum or under reduced pressure by evaporation or the like without exposing the mixed layer 3 to a gas atmosphere including oxygen (FIG. 2A). The hole transporting layer 4 is a layer having an excellent hole transporting property, for example, a layer formed using an aromatic amine (i.e., having a benzene ring-nitrogen bond) compound such as NPB, TPD, TDATA, MTDATA, or BSPB. These substances mentioned here mainly have hole mobility of $1\times10^{-6}$ to 10 cm$^2$/Vs. Note that other substance may be used so long as it has a stronger hole transporting property than an electron transporting property. Note that the hole transporting layer 4 may be formed by not only a single layer but also a stacked layer in which two or more layers made from the above mentioned substances are stacked.

Subsequently, a light emitting layer 5 is formed to have a thickness of 5 to 10 nm in vacuum or under reduced pressure by evaporation or the like (FIG. 2A). The light emitting layer 5 is not particularly limited. Layers serving as the light emitting layer are broadly classified into two modes. One mode is a host-guest type layer in which a light emitting substance (a dopant material), which becomes a light emitting center, is dispersed in a layer made from a material (a host material) with larger energy gap than that of the light emitting substance. Another mode is a light emitting layer, which is formed only by using a light emitting material. The former layer has preferable structure since light quenching due to a concentration does not easily occur. As the light emitting substance, which becomes the light emitting center, 4-dicyanomethylene-2-methyl-6-(1,1,7,7-tetramethyljulolidyl-9-enyl)-4H-pyran (abbreviation: DCJT); 4-dicyanomethylene-2-t-butyl-6-(1,1,7,7-tetramethyljulolidyl-9-enyl)-4H-pyran; periflanthene; 2,5-dicyano-1,4-bis(10-methoxy-1,1,7,7-tetramethyljulolidyl-9-enyl)benzene; N,N'-dimethylquinacridon (abbreviation: DMQd); coumarin 6; coumarin 545T; tris(8-quinolinolato)aluminum (abbreviation: Alq$_3$); 9,9'-bianthryl; 9,10-diphenylanthracene (abbreviation: DPA);

9,10-bis(2-naphthyl)anthracene (abbreviation: DNA); 2,5,8,11-tetra-t-butylperylene (abbreviation: TBP); and the like can be given.

In addition, the following substances, which emit phosphorescence, can be used as a dopant material: bis[2-(3,5-bis(trifluoromethyl)phenyl)pyridinato-N,$C^{2'}$]iridium(III)picolinato (abbreviation: Ir($CF_3$ppy)$_2$(pic)); bis[2-(4,6-difluorophenyl)pyridinato-N,$C^{2'}$]iridium(III)acetylacetonato (abbreviation: FIr(acac)); bis[2-(4,6-difluorophenyl)pyridinato-N,$C^{2'}$]iridium(III)picolinato (abbreviation: FIr(pic)); tris(2-phenylpyridinato-N,$C^{2'}$)iridium (abbreviation: Ir(ppy)$_3$); and the like.

As the host material, an anthracene derivative such as 9,10-di(2-naphthyl)-2-tert-butylanthracene (abbreviation: t-BuDNA); a carbazole derivative such as 4,4'-bis(N-carbazolyl)biphenyl (abbreviation: CBP); a metal complex such as tris(8-quinolinolato)aluminum (abbreviation: Alq$_3$), tris(4-methyl-8-quinolinolato)aluminum (abbreviation: Almq$_3$), bis(10-hydroxybenzo[h]-quinolinato)beryllium (abbreviation: BeBq$_2$), bis(2-methyl-8-quinolinolato)-4-phenylphenolato-aluminum (abbreviation: BAlq), bis[2-(2-hydroxyphenyl)pyridinato]zinc (abbreviation: Znpp$_2$), or bis[2-(2-hydroxyphenyl)benzoxazolato]zinc (abbreviation: ZnBOX); or the like can be used. Furthermore, as a material only by which the light emitting layer 5 can be formed, tris(8-quinolinolato)aluminum (abbreviation: Alq$_3$), 9,10-bis(2-naphthyl)anthracene (abbreviation: DNA), bis(2-methyl-8-quinolinolato)-4-phenylphenolato-aluminum (abbreviation: BAlq), and the like can be given.

An electron transporting layer 6 is formed to have a thickness of 5 to 100 nm over the light emitting layer 5 in vacuum or under reduced pressure by evaporation or the like (FIG. 2A). The electron transporting layer 6 is a layer having an excellent electron transporting property, and for example, a layer formed using a metal complex having a quinoline skeleton or a benzoquinoline skeleton such as tris(8-quinolinolato)aluminum (abbreviation: Alq$_3$), tris(5-methyl-8-quinolinolato)aluminum (abbreviation: Almq$_3$), bis(10-hydroxybenzo[h]-quinolinato)beryllium (abbreviation: BeBq$_2$), and bis(2-methyl-8-quinolinolato)-4-phenylphenolato-aluminum (abbreviation: BAlq). In addition, a metal complex having an oxazole ligand or a thiazole ligand such as bis[2-(2-hydroxyphenyl)benzoxazolato]zinc (abbreviation: ZnBOX) and bis[2-(2-hydroxyphenyl)benzothiazolato]zinc (abbreviation: Zn(BTZ)$_2$); and the like can be used. In addition to the metal complexes, 2-(4-biphenylyl)-5-(4-tert-butylphenyl)-1,3,4-oxadiazole (abbreviation: PBD); 1,3-bis[5-(p-tert-butylphenyl)-1,3,4-oxadiazole-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); and the like can be used. These substances mentioned here mainly have electron mobility of $1\times10^{-6}$ to 10 cm$^2$/Vs. Note that other substance may be used as the electron transporting layer 6 so long as it has a stronger electron transporting property than a hole transporting property. Further, the electron transporting layer 6 may be formed by not only a single layer but also a stacked layer in which two or more layers made from the above mentioned substances are stacked.

A cathode 7 is formed to have a thickness of 10 to 200 nm over the electron transporting layer 6 in vacuum or under reduced pressure by evaporation or the like, and thus the light emitting device is completed (FIG. 2A). The cathode 7 can be formed by using metal having a low work function (3.8 eV or less), an alloy, an electroconductive compound, a mixture thereof, or the like. As specific examples of a cathode material, an element belonging to Group 1 or 2 of the periodic table, i.e., alkali metal such as lithium (Li) or cesium (Cs), alkali earth metal such as magnesium (Mg), calcium (Ca), or strontium (Sr), and an alloy containing these substances (e.g., Mg:Ag, Al:Li, or the like) can be given. However, when providing a layer having an excellent electron injecting property (an electron injecting layer, not shown) is provided between the cathode 7 and the light emitting layer 5 to be in contact with the cathode 7, the cathode 7 can be formed by using various kinds of conductive materials including the materials given for the materials of the anode 2 such as Al, Ag, ITO, and ITO containing silicon, regardless of a work function.

Note that as the layer having the excellent electron injecting property, a compound of alkali metal or alkali earth metal such as lithium fluoride (LiF), cesium fluoride (CsF), and calcium fluoride (CaF$_2$) can be used. In addition, a substance having an electron transporting property, which contains alkali metal or alkali earth metal, and for example, Alq$_3$ containing magnesium (Mg) or the like can be used.

The mixed layer 3, the hole transporting layer 4, the light emitting layer 5, and the electron transporting layer 6 can be formed by evaporation. Alternatively, these layers can be formed by a droplet discharging method or a wet method such as spin coating. Note that the mixed layer 3 and layers stacked thereover are necessary to be formed without being exposed to a gas atmosphere including oxygen. Furthermore, a different method may be used to form each electrode or for each layer.

Since the light emitting device is sometimes deteriorated by moisture and the like, formation of a passivation film or sealing may be carried out as described below.

In this embodiment mode, as a passivation film 8, a silicon oxide film containing nitrogen is formed to have a thickness of 10 to 1,000 nm by plasma CVD, sputtering, or the like. When using the silicon oxide film containing nitrogen, a silicon oxynitride film may be formed using SiH$_4$, N$_2$O, and NH$_3$ by plasma CVD; or a silicon oxynitride film may be formed using SiH$_4$ and N$_2$O by plasma CVD; or a silicon oxynitride film may be formed using a gas in which SiH$_4$ and N$_2$O are diluted with Ar by plasma CVD.

Further, a hydrogenated silicon oxynitride film formed using SiH$_4$, N$_2$O, and H$_2$ may be employed. Of course, the passivation film is not limited to a single layer structure, and may include a single layer structure or a stacked layer structure including other insulating layer containing silicon. Further, a multilayer film of a carbon nitride film and a silicon nitride film, a multilayer film of styrenepolymer, a silicon nitride film, or a diamond like carbon film may be formed as substitute for the silicon oxide film containing nitrogen.

Figure 2B:
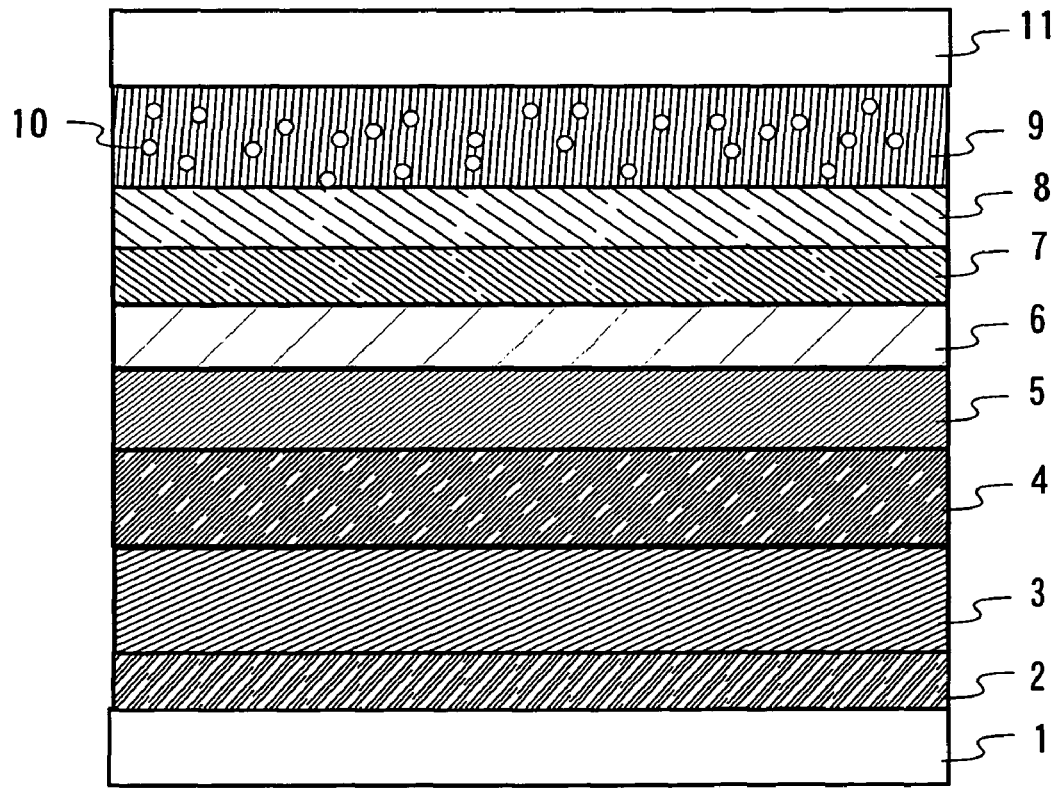

Subsequently, sealing is performed to protect the light emitting device from a substance promoting deterioration such as moisture (FIG. 2B). In this embodiment mode, a counter substrate 11 is used for sealing, and the counter substrate 11 is attached by a sealing material having an insulating property such that an external connection portion is exposed. A space between the counter substrate 11 and the substrate 1 may be filled with an inert gas such as dry nitrogen. Alternatively, a sealing material or a resin 9 having a light transmitting property may be applied over a surface and the counter substrate 11 may be attached to the substrate 1 by using it. An ultraviolet curing resin or the like is preferably used as the sealing material. A drying agent 10 or particles 10 for keep a constant gap between the substrates may be mixed in the sealing material. Subsequently, a flexible wiring substrate is attached to the external connection portion. In this light emitting device, after forming the mixed layer 3, the mixed layer is exposed to the nitrogen gas atmosphere without being exposed to a gas atmosphere including oxygen, and therefore, the life of the light emitting device can be prolonged.

Figure 21:
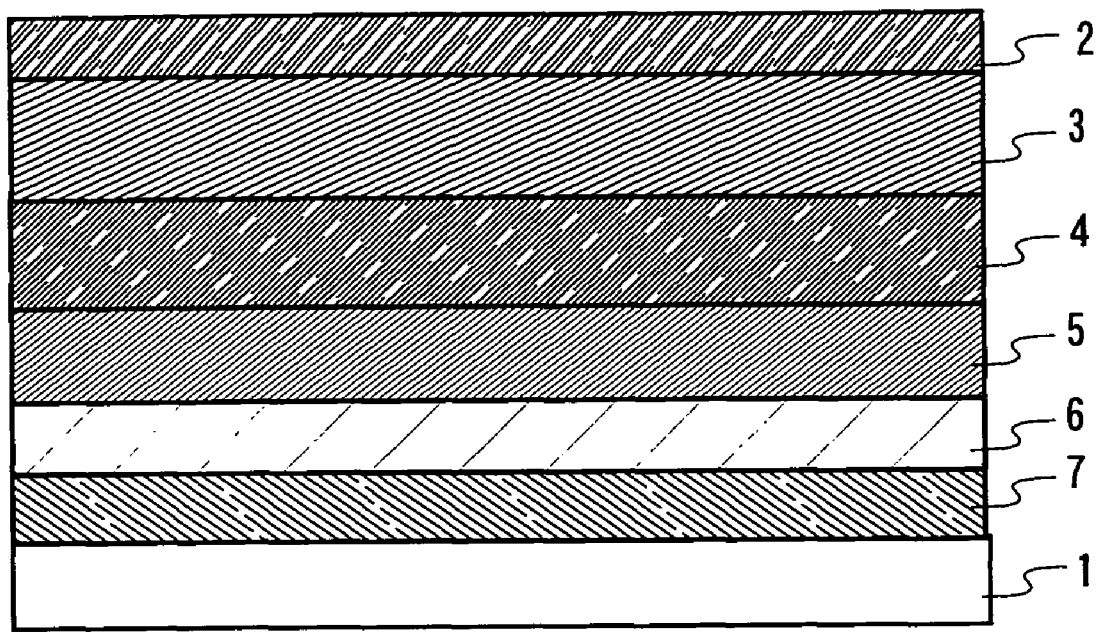
FIG. 21 is a cross sectional view explaining a method for manufacturing a light emitting device of the present invention.

As set forth above, the anode 2 is formed over the substrate 1 and the mixed layer 3 is formed over the anode 2. Alternatively, this embodiment mode is applicable to a light emitting device having a structure in which the cathode 7 is formed over the substrate 1, the electron transporting layer 6 is formed over the cathode 7, the light emitting layer 5 is formed over the electron transporting layer 6, the hole transporting layer 4 is formed over the light emitting layer 5, the mixed layer 3 is formed over the hole transporting layer 4, and the anode 2 is formed over the mixed layer 3 (FIG. 21).

After forming the mixed layer 3, the mixed layer 3 is exposed to the nitrogen gas atmosphere, where moisture is reduced as much as possible, at a room temperature without being exposed to a gas atmosphere including oxygen, and then the anode 2 is formed without exposing the mixed layer 3 to a gas atmosphere including oxygen.

As a method for exposing the mixed layer 3 to the nitrogen gas atmosphere, the above described method can be employed. Further, after the mixed layer 3 is exposed to the nitrogen gas atmosphere, the nitrogen gas may be evacuated, and then the mixed layer 3 may be exposed to a nitrogen gas atmosphere again. Alternatively, the mixed layer 3 may be sprayed with the nitrogen gas so as to be exposed to the nitrogen gas atmosphere.

In this case, the substrate 1, the cathode 7, the electron transporting layer 6, the light emitting layer 5, the hole transporting layer 4, the mixed layer 3, and the anode 2 described above can be used. Further, the light emitting device can be manufactured in vacuum or under reduced pressure by evaporation or the like as described above.

Moreover, an electron injecting layer may be formed between the cathode 7 and the electron transporting layer 6.

Embodiment Mode 2

In this embodiment mode, a structure different from the structure shown in Embodiment Mode 1 will be described. In the structure shown in this embodiment mode, the mixed layer 3 is provided to be in contact with the cathode.

Figure 3A:
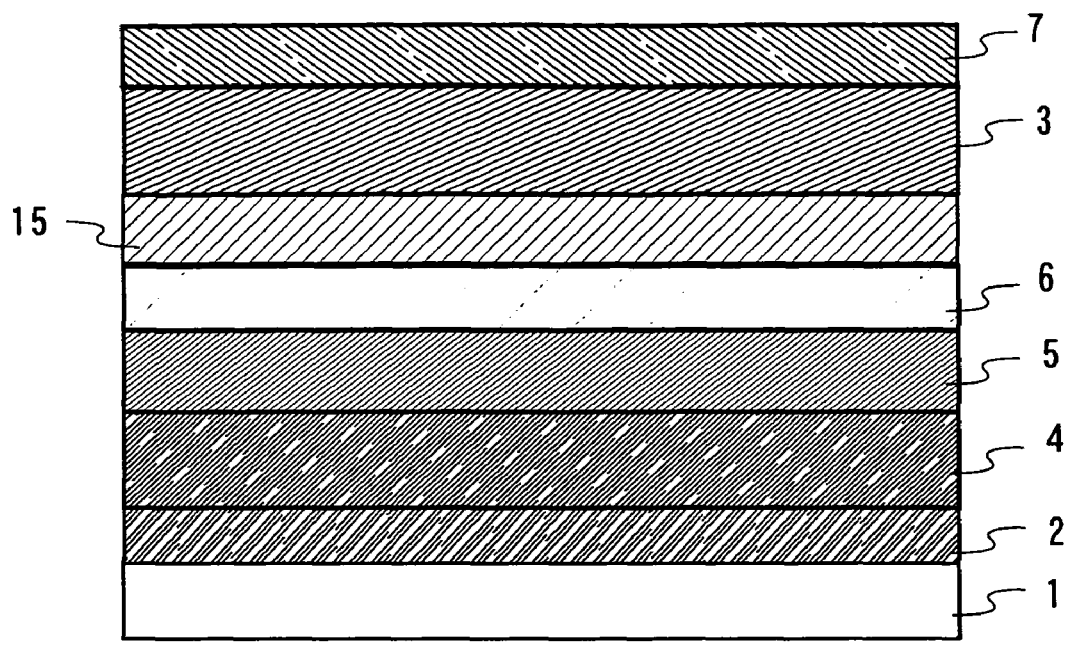
FIGS. 3A and 3B are cross sectional views explaining a method for manufacturing a light emitting device of the present invention.

FIG. 3A shows one example of a structure of a light emitting device. In FIG. 3A, the hole transporting layer 4, the light emitting layer 5, the electron transporting layer 6, a first layer 15, the mixed layer 3 are stacked between the anode 2 and the cathode 7. The anode 2, the cathode 7, the hole transporting layer 4, the light emitting layer 5, the electron transporting layer 6, and the mixed layer 3 shown in Embodiment Mode 1 can be used in this embodiment mode.

The first layer 15 is an electron injecting layer and contains a substance having an electron donating property and a substance having an electron transporting property. As the substance having the electron donating property contained in the first layer 15, alkali metal, alkali earth metal, or oxide or salt thereof is preferable. Specifically, lithium, cesium, calcium, lithium oxide, calcium oxide, barium oxide, cesium carbonate, and the like can be given. As the substance having the electron transporting property, the compounds, which can be used for forming the electron transporting layer described in Embodiment Mode 1, can be used. The first layer 15 is formed to have a thickness of 1 to 100 nm by evaporation or the like.

Figure 3B:
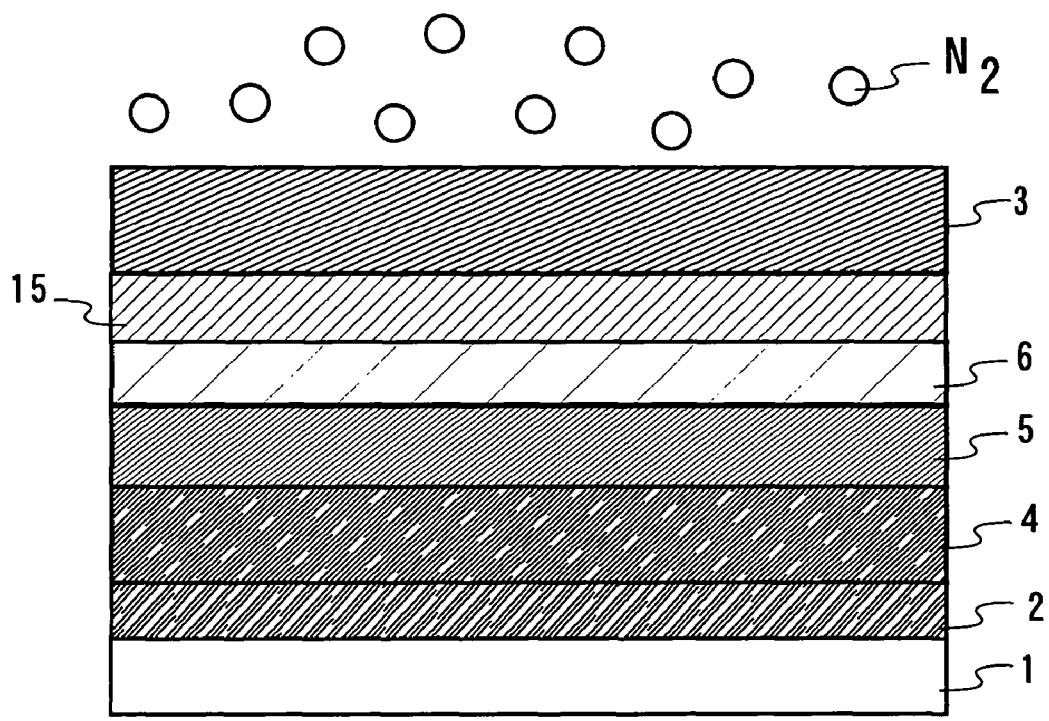

After forming the first layer 15, the mixed layer 3 is formed in vacuum or under reduced pressure as shown in Embodiment Mode 1. Thereafter, the mixed layer 3 is exposed to a nitrogen gas atmosphere at a room temperature without being exposed to a gas atmosphere including oxygen (FIG. 3B). The amount of moisture contained in the nitrogen gas is set to be 40 ppm or less, and preferably, 3 ppm or less. The nitrogen gas is introduced in a chamber, in which a substrate 1 over which the mixed layer 3 is formed is set, at a flow rate of 1 to 500 sccm such that pressure inside the chamber becomes $1 \times 10^{-1}$ to $1 \times 10^{6}$ Pa.

While maintaining the pressure inside the chamber to be the above described pressure value, the substrate 1 is left for 1 to 24 hours so that the mixed layer 3 is exposed to the nitrogen gas atmosphere. Alternatively, the mixed layer 3 may be sprayed with nitrogen gas. In this case, the substrate 1 is not necessary to be left for 1 to 24 hours, and the nitrogen gas may be sprayed for 10 to 180 minutes.

After the mixed layer 3 is exposed to the nitrogen gas atmosphere, the nitrogen gas inside the chamber is removed to make a vacuum state or a reduce pressure state, and then the mixed layer 3 may be exposed to a nitrogen gas atmosphere again as described above. This can prolong the life of the light emitting device.

Thereafter, the cathode 7 is formed in vacuum or under reduced pressure without exposing the mixed layer 3 to a gas atmosphere including oxygen, and thus the light emitting device is completed. Further, in the same manner as Embodiment Mode 1, the passivation film 8 may be formed, and then sealing may be performed to protect the light emitting device from a substance promoting deterioration such as moisture.

Figure 22:
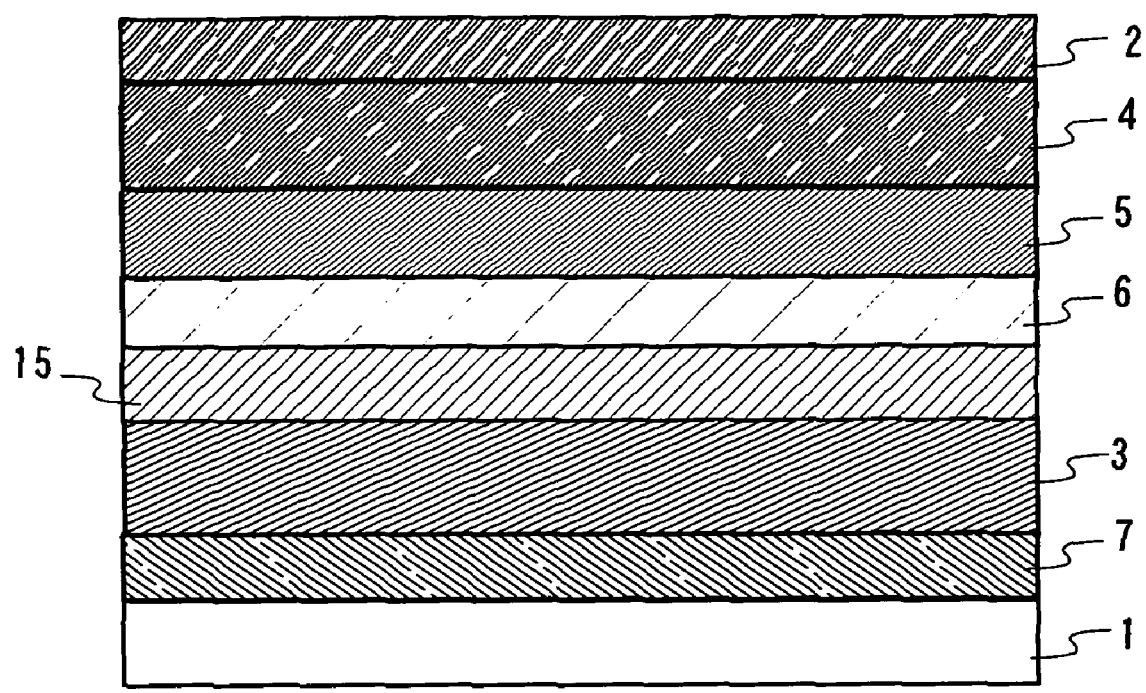
FIG. 22 is a cross sectional view explaining a method for manufacturing a light emitting device of the present invention.

As set forth above, the anode 2 is formed over the substrate 1, and the mixed layer 3 and the cathode 7 are formed over the anode 2. However, this embodiment mode is applicable to a light emitting device having a structure in which the cathode 7 is formed over the substrate 1, the mixed layer 3 is formed over the cathode 7, the first layer 15 is formed over the mixed layer 3, the electron transporting layer 6 is formed over the first layer 15, the light emitting layer 5 is formed over the electron transporting layer 6, the hole transporting layer 4 is formed over the light emitting layer 5, and the anode 2 is formed over the hole transporting layer 4 (FIG. 22).

After forming the mixed layer 3, the mixed layer 3 is exposed to the nitrogen gas atmosphere, where moisture is reduced as much as possible, at a room temperature without exposing the mixed layer 3 to a gas atmosphere including oxygen, and then the first layer 15 is formed without exposing the mixed layer to a gas atmosphere including oxygen.

As a method for exposing the mixed layer 3 to the nitrogen gas atmosphere, the above described method can be employed. Further, after the mixed layer 3 is exposed to the nitrogen gas atmosphere, the nitrogen gas may be evacuated, and then the mixed layer 3 may be exposed to a nitrogen gas atmosphere again. Alternatively, the mixed layer 3 may be sprayed with nitrogen gas so as to be exposed to the nitrogen gas atmosphere.

The substrate 1, the cathode 7, the mixed layer 3, the first layer 15, the electron transporting layer 6, the light emitting layer 5, the hole transporting layer 4, and the anode 2 as described above can be used in this case. Further, the light emitting device can be manufactured in vacuum or under reduced pressure by evaporation or the like as described above.

Moreover, a hole injecting layer may be formed between the hole transporting layer 4 and the anode 2.

Embodiment Mode 3

In this embodiment mode, mixed layers are provided to be in contact with a cathode and an anode.

Figure 4:
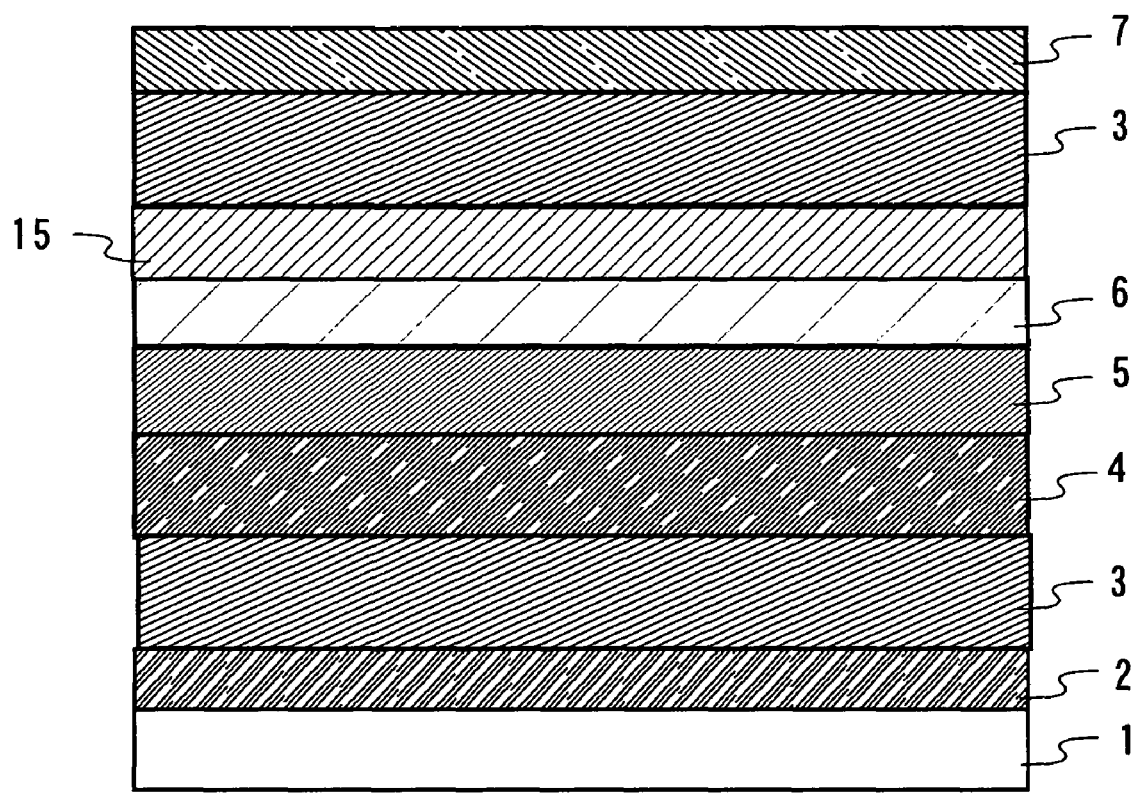
FIG. 4 is a cross sectional view explaining a method for manufacturing a light emitting device of the present invention.

An example of a structure of a light emitting device is shown in FIG. 4. In FIG. 4, a first mixed layer 3, a hole transporting layer 4, a light emitting layer 5, an electron transporting layer 6, a first layer 15, and a second mixed layer 3 are stacked between an anode 2 and a cathode 7. They can be formed by using the layers, the anode, and the cathode shown in Embodiment modes 1 and 2. Further, an organic compound and metal oxide used for the first mixed layer may be identical to or different from an organic compound and metal oxide used for the second mixed layer.

Figure 5A:
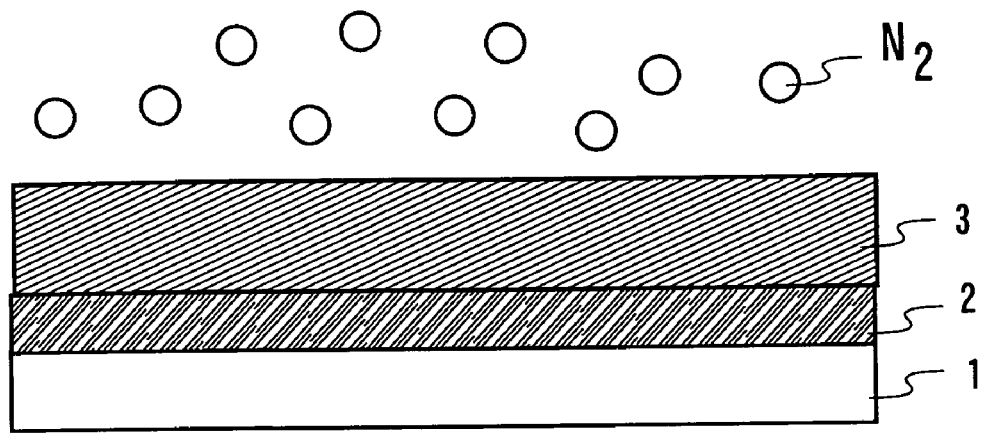
FIGS. 5A and 5B are cross sectional views explaining a method for manufacturing a light emitting device of the present invention.
Figure 5B:
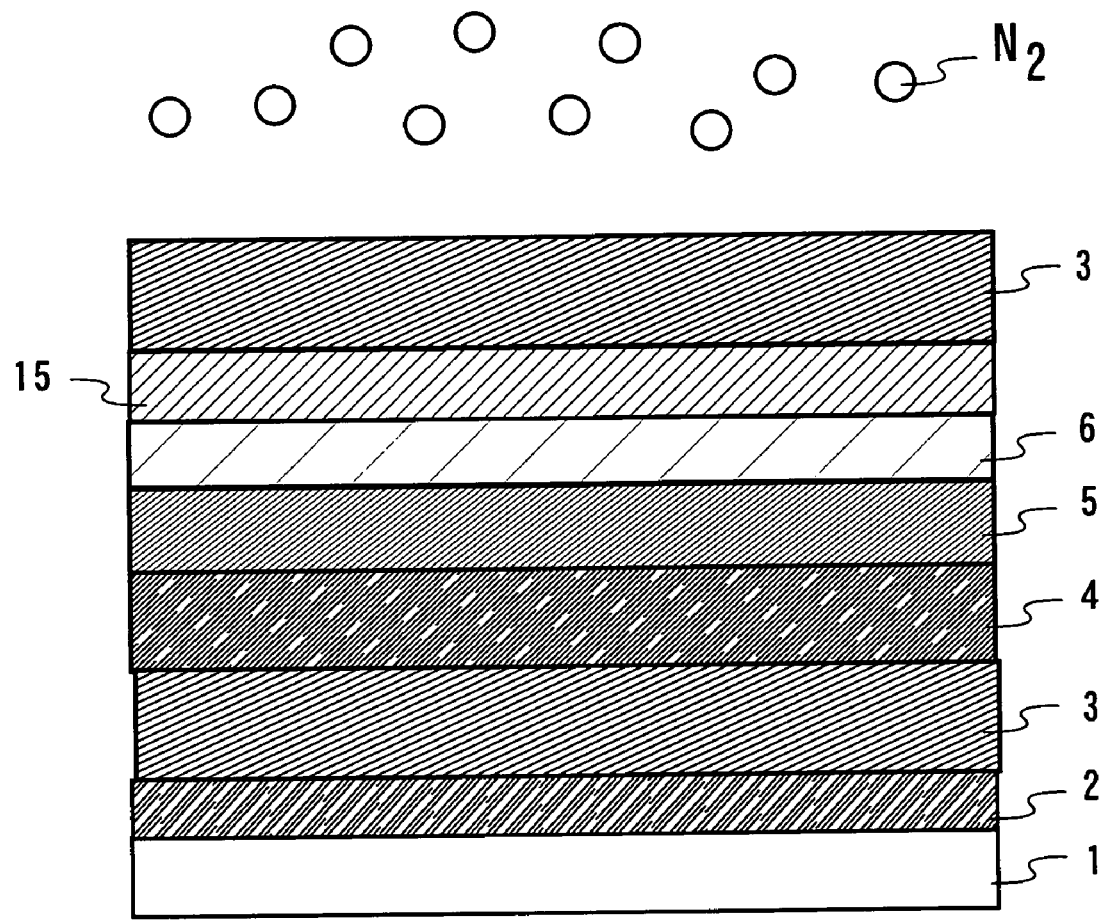

After forming the first mixed layer 3 and the second mixed layer 3 in vacuum or under reduced pressure, the first and second mixed layers 3 are exposed to a nitrogen gas atmosphere at a room temperature without being exposed to a gas atmosphere including oxygen as shown in Embodiment Modes 1 and 2 (FIGS. 5A and 5B). The amount of moisture contained in the nitrogen gas is set to be 40 ppm or less, and preferably, 3 ppm or less. The nitrogen gas is introduced in the chamber, in which the substrate 1 over which the first and second mixed layers 3 are formed is set. Moisture is desirably removed from the nitrogen gas as much as possible. The nitrogen gas is introduced at a flow rate of 1 to 500 sccm such that pressure inside the chamber becomes $1\times10^{-1}$ to $1\times10^6$ Pa.

While maintaining the pressure inside the chamber, the substrate 1 is left for 1 to 24 hours so that the first and second mixed layers 3 are exposed to the nitrogen gas atmosphere. Alternatively, the first and second mixed layers 3 may be sprayed with the nitrogen gas. In this case, the substrate 1 is not necessary to be left for 1 to 24 hours, and the nitrogen gas may be sprayed for 10 to 180 minutes.

After the first and second mixed layers 3 are exposed to the nitrogen gas atmosphere, the nitrogen gas inside the chamber is removed to made a vacuum state or a reduced pressure state, and then the first and second mixed layers 3 are exposed to a nitrogen gas atmosphere again as described above. Thereafter, the hole transporting layer 4 and the cathode 7 are formed in vacuum or under reduced pressure without exposing the first and second mixed layers to a gas atmosphere including oxygen. This can prolong the life of the light emitting device.

Figure 23:
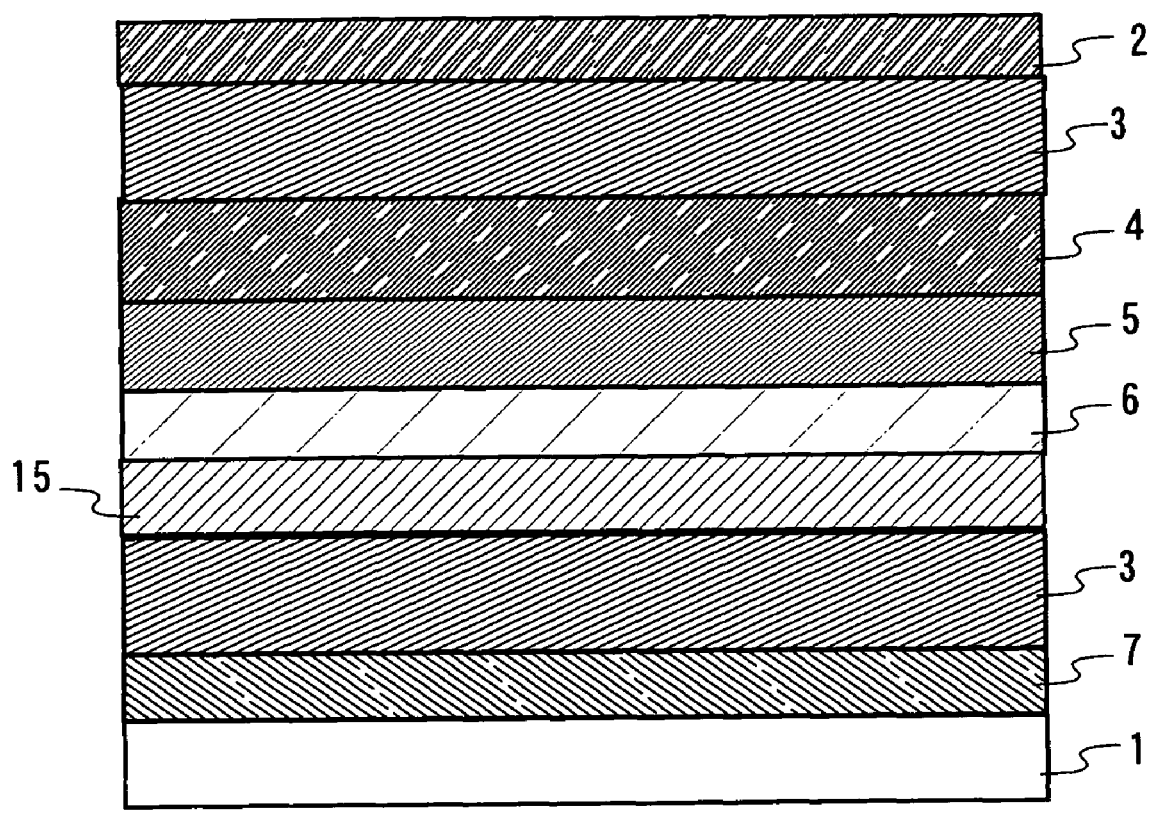
FIG. 23 is a cross sectional view explaining a method for manufacturing a light emitting device of the present invention.

As set forth above, the anode 2 is formed over the substrate 1, and the cathode 7 is formed over the anode 2. However, this embodiment mode is applicable to a light emitting device having a structure in which the cathode 7 is formed over the substrate 1, the first mixed layer 3 is formed over the cathode 7, the first layer 15 is formed over the first mixed layer 3, the electron transporting layer 6 is formed over the first layer 15, the light emitting layer 5 is formed over the electron transporting layer 6, the hole transporting layer 4 is formed over the light emitting layer 5, the second mixed layer 3 is formed over the hole transporting layer 4, and the anode 2 is formed over the second mixed layer 3 (FIG. 23).

After forming the first mixed layer 3, the first mixed layer 3 is exposed to the nitrogen gas atmosphere at a room temperature without being exposed to a gas atmosphere including oxygen, and then the first layer 15 is formed without exposing the first mixed layer 3 to a gas atmosphere including oxygen. Further, after forming the second mixed layer 3, the second mixed layer 3 is exposed to the nitrogen gas atmosphere without being exposed to a gas atmosphere including oxygen, and then the anode 2 is formed without exposing the second mixed layer 3 to a gas atmosphere including oxygen.

As a method for exposing the first and second mixed layers 3 to the nitrogen gas atmosphere, the above described method can be employed. Further, after the first and second mixed layers 3 are exposed to the nitrogen gas atmosphere, the nitrogen gas may be evacuated, and then the first and second mixed layers 3 may be exposed to a nitrogen gas atmosphere again. Alternatively, the first and second mixed layers 3 may be sprayed with the nitrogen gas so as to be exposed to the nitrogen gas atmosphere. The amount of moisture contained in the nitrogen gas is set to be 40 ppm or less, and preferably, 3 ppm or less.

Moreover, the light emitting device can be formed in vacuum or under reduced pressure by evaporation or the like as described above.

Embodiment Mode 4

A mixed layer 3 is formed through a different method from the methods shown in Embodiment Modes 1 to 3. In this embodiment mode, the mixed layer 3 is not formed at once but formed in plural times.

Figure 6A:
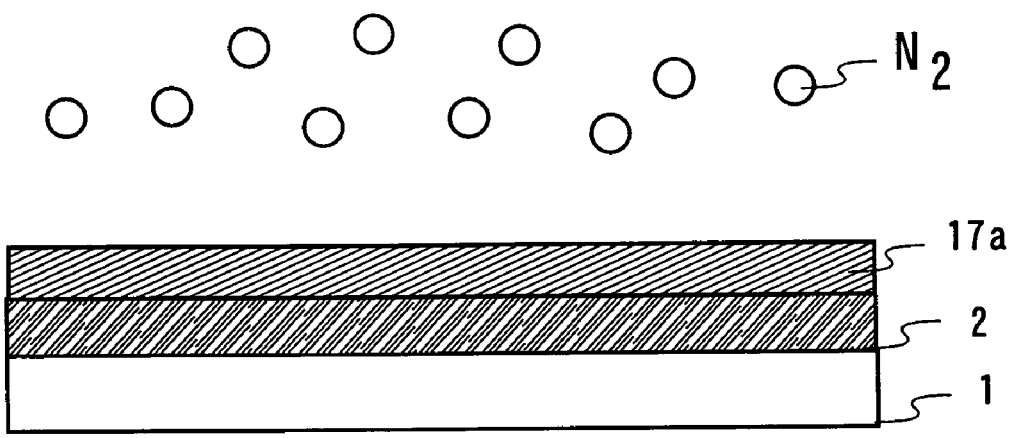
FIGS. 6A and 6B are cross sectional views explaining a method for manufacturing a light emitting device of the present invention.

As shown in FIGS. 1A and 1B, an anode 2 is formed over a substrate 1. The anode 2 is subjected to heat treatment in vacuum or under reduced pressure to remove moisture and the like. Then, a first mixed layer 17a is formed to have a thickness of 10 to 30 nm in vacuum or under reduced pressure. Thereafter, the first mixed layer 17a is exposed to a nitrogen gas atmosphere where the moisture content is reduced as much as possible, at a room temperature without being exposed to a gas atmosphere including oxygen as shown in the above embodiment modes (FIG. 6A).

Figure 6B:
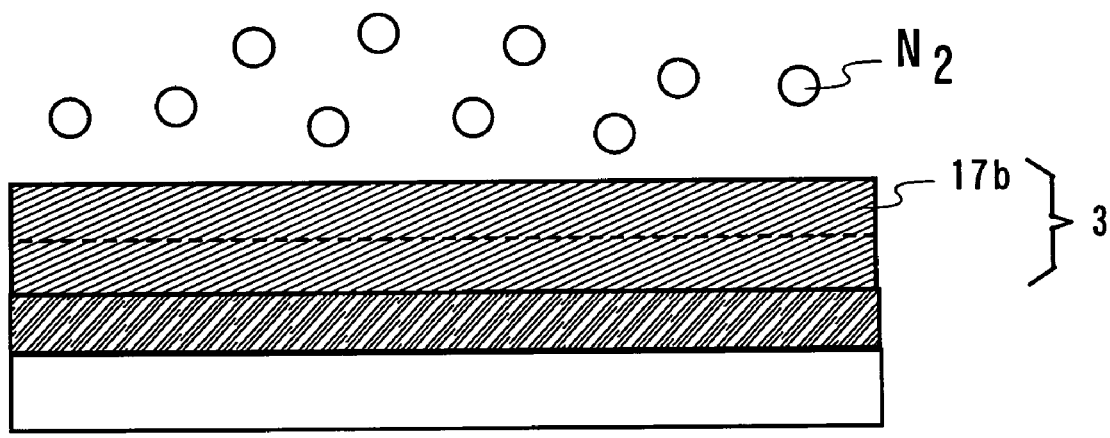

Next, a second mixed layer 17b is formed to have a thickness of 10 to 30 nm in vacuum or under reduced pressure while the first mixed layer 17a is not exposed to a gas atmosphere including oxygen. Thereafter, the second mixed layer 17b is exposed to the nitrogen atmosphere where the moisture content is reduced as much as possible, at a room temperature without being exposed to a gas atmosphere including oxygen in the same manner as described in the above embodiment modes. Thus, a mixed layer 3 is formed (FIG. 6B). While keeping constant pressure inside the chamber, the first and second mixed layers 17a and 17b are left for 1 to 24 hours to be exposed to the nitrogen gas atmosphere as shown in the above embodiment modes. Alternatively, the first and second mixed layers 17a and 17b may be sprayed with the nitrogen gas.

Further, after the first and second mixed layers are exposed to the nitrogen gas atmosphere, the nitrogen gas in the chamber may be removed to form a vacuum state or a reduce pressure state, and then the first and second mixed layers may be exposed to a nitrogen gas atmosphere again.

Subsequently, a hole transporting layer and the like are formed in vacuum or under reduced pressure without exposing the second mixed layer 17b to a gas atmosphere including oxygen so that the light emitting device is manufactured. This can prolong the life of the light emitting device.

This is applicable to a case where the mixed layer 3 is provided to be in contact with the cathode. Specifically, after forming the first layer (electron injecting layer) 15, the first mixed layer is formed, the first mixed layer is exposed to the nitrogen gas atmosphere, the second mixed layer is formed, the second mixed layer is exposed to the nitrogen gas atmosphere, and then the cathode is formed. Note that it is obvious that this embodiment mode is applicable to the structures shown in the above embodiment modes.

Further, this embodiment mode is applicable to a light emitting device, in which an anode 2 is formed over a substrate 1, an hole transporting layer is formed over the anode 2, a light emitting layer is formed over the hole transporting layer, an electron transporting layer is formed over the light emitting layer, a first layer is formed over the electron transporting layer, a first mixed layer 3 is formed over the first layer, the first mixed layer is exposed to a nitrogen gas atmosphere at a room temperature, a second mixed layer is formed, the second mixed layer is exposed to a nitrogen gas atmosphere where the moisture content is reduced as much as possible, and then a cathode 7 is formed.

Furthermore, this embodiment mode is also applicable to a light emitting device, in which the cathode 7 is formed over a substrate 1, the first mixed layer 3 layer is formed over the cathode 7, the first mixed layer 3 is exposed to a nitrogen gas atmosphere at a room temperature, the second mixed layer is formed, the second mixed layer is exposed to the nitrogen gas atmosphere, the first layer 15 is formed, the electron transporting layer 6 is formed over the first layer 15, the light emitting layer 5 is formed over the electron transporting layer 6, the hole transporting layer 4 is formed over the light emitting layer 5, and the anode 2 is formed over the hole transporting layer 4.

Moreover, this embodiment mode is also applicable to a light emitting device, in which the cathode 7 is formed over a substrate 1, the electron transporting layer 6 is formed over the cathode 7, the light emitting layer 5 is formed over the electron transporting layer 6, the hole transporting layer 4 is formed over the light emitting layer 5, the first mixed layer 3 layer is formed over the hole transporting layer 4, the first mixed layer 3 is exposed to a nitrogen gas atmosphere at a room temperature, a second mixed layer is formed, the second mixed layer is exposed to the nitrogen gas atmosphere where the moisture content is reduced as much as possible, and the anode 2 is formed.

Embodiment Mode 5

Figure 7:
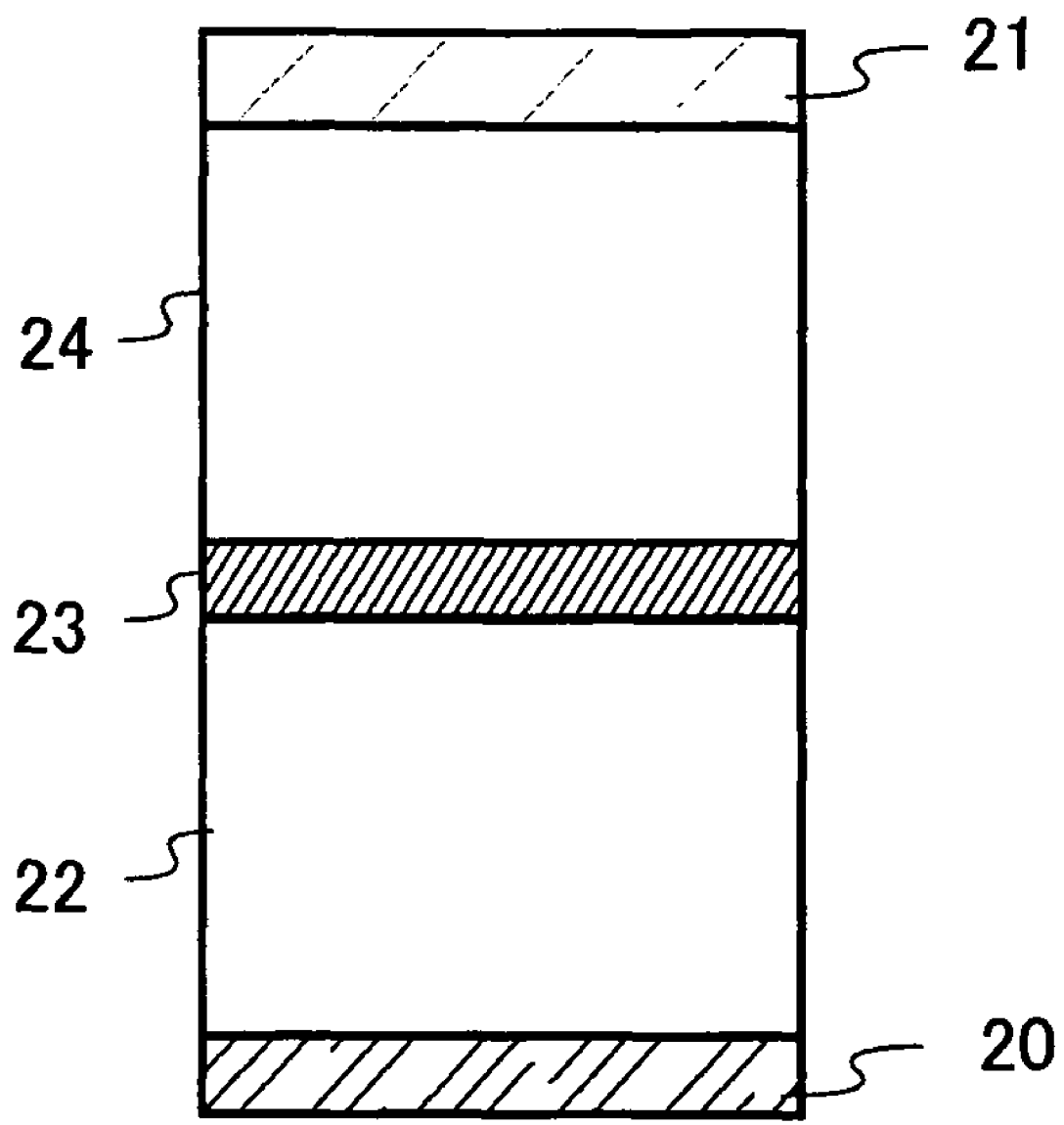
FIG. 7 is a diagram explaining a method for manufacturing a light emitting device of the present invention.

In this embodiment mode, a structure different from the structures shown in the above embodiment modes will be described. Specifically, a light emitting device (a tandem light emitting device) in which a plurality of light emitting units are stacked, will be described. The light emitting device includes a plurality of light emitting units between an anode and a cathode. FIG. 7 shows a tandem light emitting device in which two light emitting units are stacked. The plurality of light emitting units are connected in series through a charge generating layer, and a mixed layer including an organic compound and metal oxide is applied to the charge generating layer.

In FIG. 7, a first light emitting unit 22 and a second light emitting unit 24 are stacked between an anode 20 and a cathode 21. A charge generating layer 23 is formed between the first light emitting unit 22 and the second light emitting unit 24.

The anode 20 and the cathode 21 can be respectively formed using the materials shown in the above embodiment mode.

Each of the first light emitting unit 22 and the second light emitting unit 24 has a structure in which hole transporting layers, light emitting layers, and electron transporting layers are stacked over the anode 20. Specifically, a whole of the first and second light emitting units has a stacked structure in which an anode, a hole transporting layer, a light emitting layer, an electron transporting layer, a charge generating layer, another hole transporting layer, another light emitting layer, another electron transporting layer, and a cathode are stacked. The hole transporting layers and the electron transporting layers are not necessarily provided in this structure, and may be provided, if required. Further, a hole injecting layer, an electron injecting layer, and the like may be provided, if required. The light emitting units can be formed by using the materials show in the above embodiment mode.

The charge generating layer 23 is formed by combining a mixed layer including an organic compound and metal oxide shown in the above embodiment mode and a layer including a substance having an electron donating property and a substance having an electron transporting property shown in the above embodiment mode. The charge generating layer 23 may be formed by combining a mixed layer and a transparent conductive film. Since the mixed layer has high transmittance of visible light, transmittance of light generated in the first light emitting unit and the second light emitting unit is also high, making it possible to improve light extraction efficiency to an external portion.

As the substance having the electron donating property, alkali metal, alkali earth metal, or oxide or salt thereof is preferable. Specifically, lithium, cesium, calcium, lithium oxide, calcium oxide, barium oxide, cesium carbonate, and the like can be given. As the substance having the electron transporting property, the substances, which can be used for forming the electron transporting layer, can be used.

Figure 8A:
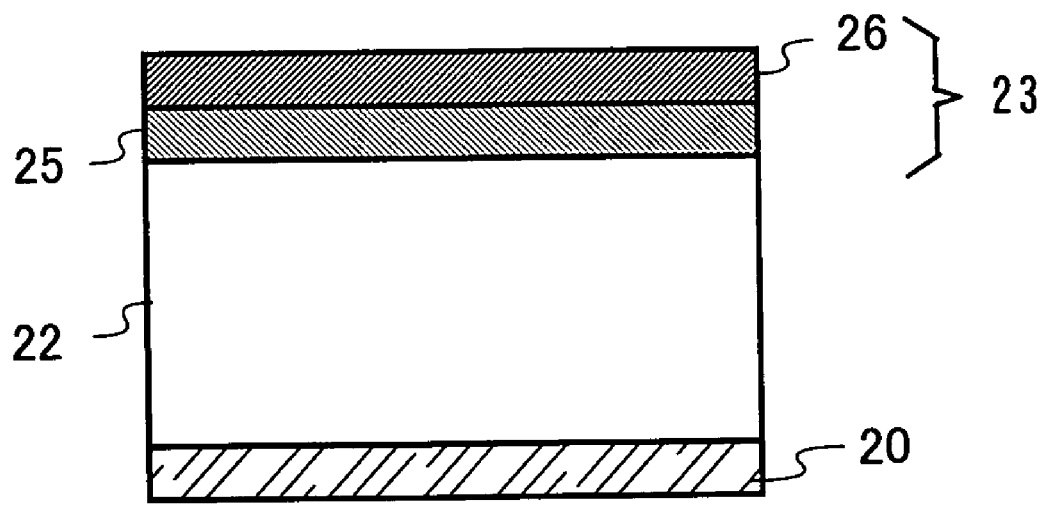
FIGS. 8A and 8B are diagrams explaining a method for manufacturing a light emitting device of the present invention.

The anode 20 and the first light emitting unit 22 are formed over a substrate, and then a layer 25 including the substance having an electron donating property and a substance having an electron transporting property is formed in vacuum or under reduced pressure by evaporation or the like. Next, a mixed layer 26 including an organic compound and metal oxide is formed in vacuum or under reduced pressure by co-evaporation or the like (FIG. 8A).

Figure 8B:
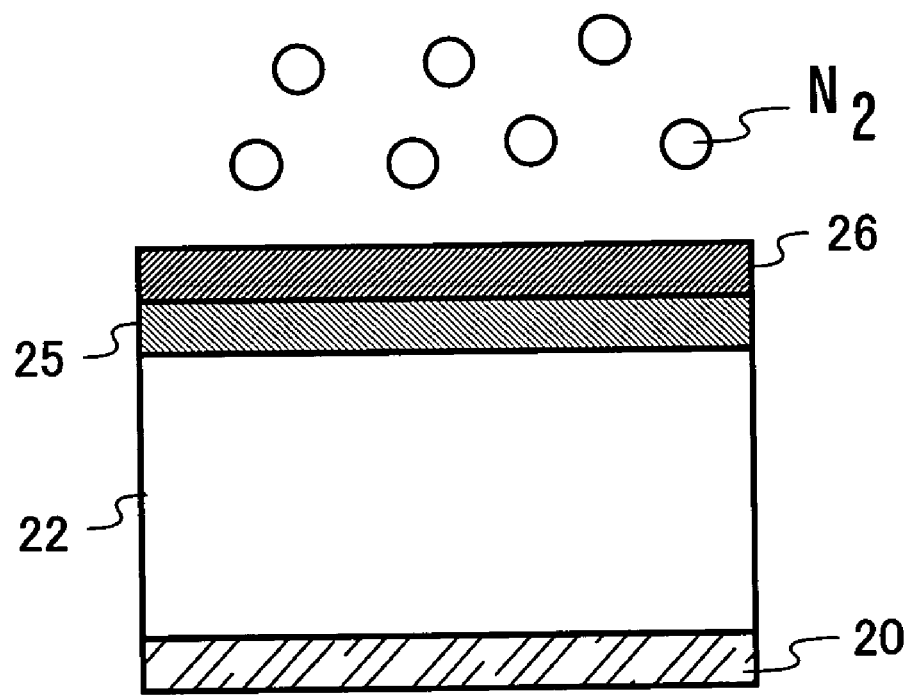

Subsequently, the mixed layer 26 is exposed to a nitrogen gas atmosphere, where the moisture content is reduced as much as possible, at a room temperature by the method shown in the above embodiment modes without being exposed to a gas atmosphere including oxygen (FIG. 8B). This can improve life of the light emitting device.

Next, the second light emitting unit 24 is formed in vacuum or under reduced pressure without exposing the mixed layer 26 to a gas atmosphere including oxygen, and then the cathode 21 is formed. Thus, the light emitting device as shown in FIG. 7 is completed. Note that sealing can be performed by using the method described in the above embodiment mode.

Further, the mixed layer 26 can be formed by plural times as described in Embodiment Mode 4.

A light emitting device having the two light emitting units is described in this embodiment mode. Further, a light emitting element in which three or more light emitting units are stacked may also be formed by using the materials shown in the present invention. For example, a light emitting device having three light emitting units has a structure in which a first light emitting unit, a first charge generating layer, a second light emitting unit, a second charge generating layer, and a third light emitting unit are stacked in this order. A mixed layer including an organic compound and metal oxide may only be contained in any one of the charge generating layers. Alternatively, mixed layers each including an organic compound and metal oxide may be contained in all of the charge generating layers. Note that this embodiment mode can be appropriately combined with other embodiment modes.

Each of the first light emitting unit 22 and the second light emitting unit 24 may have a structure in which an electron transporting layer, a light emitting layer, a hole transporting layer are stacked over a cathode.

Further, this embodiment mode is applicable to a light emitting device in which a cathode is formed, a first light emitting unit having a light emitting layer is formed over the cathode, a mixed layer including an organic compound and metal oxide is formed over the first light emitting unit, the mixed layer is exposed to a nitrogen gas atmosphere where the moisture content is reduced as much as possible at a room temperature without being exposed to a gas atmosphere including oxygen, a layer including a substance having an electron donating property and a substance having an electron transporting property is formed without exposing the mixed layer to a gas atmosphere including oxygen, a second light emitting unit is formed over the layer including the substance having the electron donating property and the substance having the electron transporting property, and an anode is formed over the second light emitting unit.

Embodiment Mode 6

In this embodiment mode, an example of a process of manufacturing a light emitting device disclosed in the present invention and a multi-chamber manufacturing apparatus used in this process will be described. In this embodiment mode, after a substrate is loaded into the multi-chamber manufacturing apparatus, films such as a mixed layer and a light emitting layer are successively formed, and then, the substrate is attached to a counter substrate, which is separately loaded into the multi-chamber manufacturing apparatus, so as to perform sealing treatment.

Figure 9:
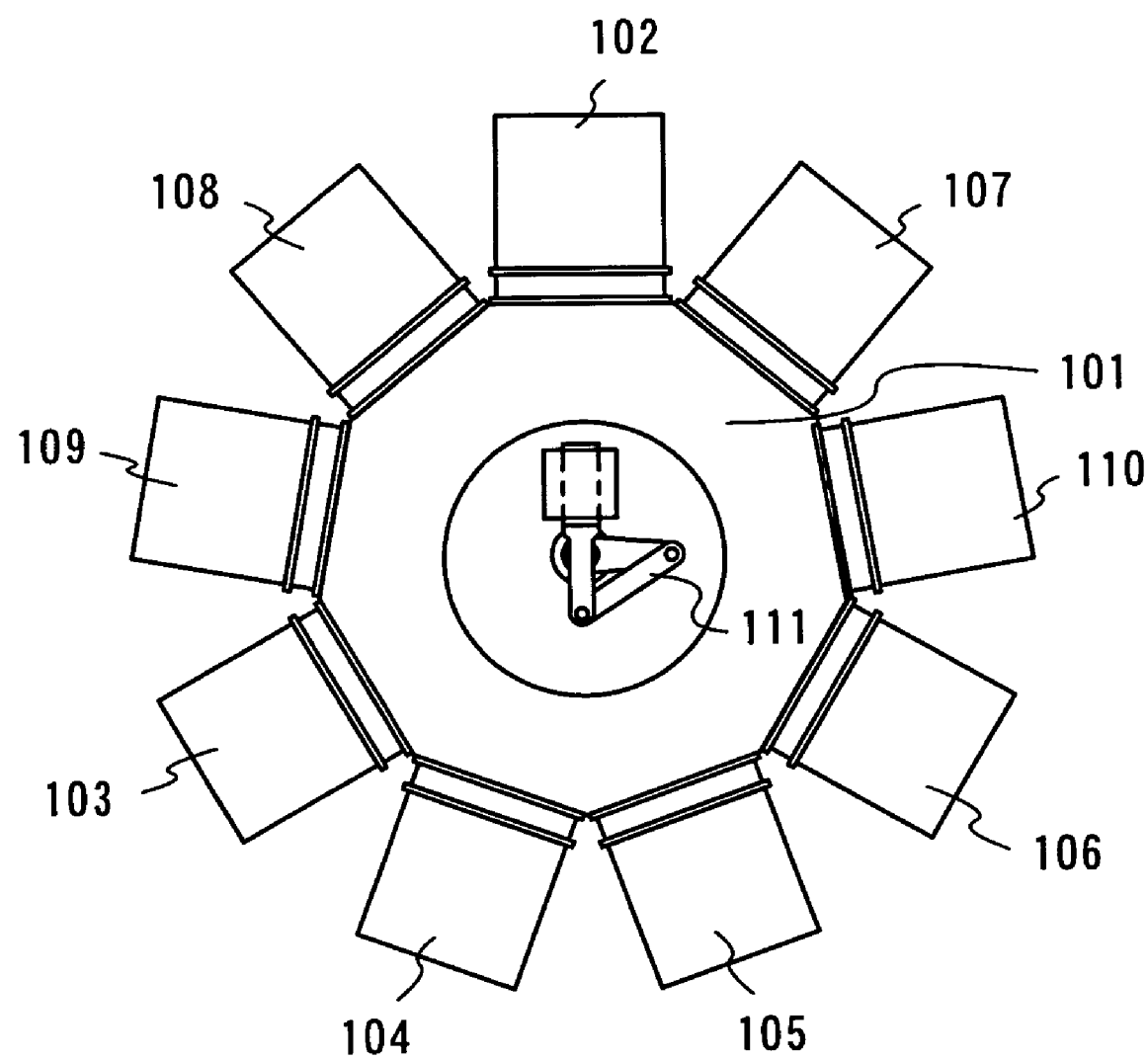
FIG. 9 is a diagram explaining an apparatus used for manufacturing a light emitting device of the present invention.

An apparatus for manufacturing a light emitting device shown in FIG. 9 has a delivery chamber 101 (attached with a delivery robot 111 for delivering a substrate, a counter substrate, a metal mask, and the like), a substrate/mask stock chamber 102 connected to the delivery chamber through a gate valve, a pretreatment chamber 103 connected to the delivery chamber through a gate valve, a first evaporation chamber 104 connected to the delivery chamber through a gate valve, a second evaporation chamber 105 connected to the delivery chamber through a gate valve, a third evaporation chamber 106 connected to the delivery chamber through a gate valve, a fourth evaporation chamber 110 connected to the delivery chamber through a gate valve, a CVD chamber 107 connected to the delivery chamber through a gate valve, a sealing glass stock chamber 108 connected to the delivery chamber through a gate valve, and a sealing chamber 109 connected to the delivery chamber through a gate valve.

First, a substrate and an evaporation metal mask are loaded into the substrate/mask stock chamber 102. The substrate/mask stock chamber 102 is made to load and unload the substrate to/from a chamber.

The substrate/mask stock chamber has an elevator structure, and substrates or masks share each stage of the elevator structure. A total of up to 10 to 15 pieces of substrates and masks can be stored in the substrate/mask stock chamber. Note that an anode is formed over each substrate outside the substrate/mask stock chamber.

On the other hand, a counter substrate is loaded in the sealing glass stock chamber 108. The sealing glass stock chamber has an elevator structure, in which a counter substrate, which is already subjected to pretreatment (typically, which indicates attachment of a drying agent for absorbing moisture inside and outside of a panel and formation of a sealing material for attaching the counter substrate to the substrate) is stored in each stage.

In this manufacturing apparatus, films are formed over all of loaded substrates first. This is called an "evaporation mode". After terminating the evaporation mode, a "sealing mode" for attaching the substrates to counter substrates starts.

The evaporation mode will be described below. First, the delivery chamber 101, the pretreatment chamber 103, the first evaporation chamber 104, the second evaporation chamber 105, the third evaporation chamber 106, the fourth evaporation chamber 110, and the CVD chamber 107 are evacuated to be a high vacuum state of $1 \times 10^{-5}$ to $1 \times 10^{-6}$ Pa. In the evaporation mode, the delivery chamber is always maintained in high vacuum. Further, each evaporation material set in each evaporation chamber is previously heated at a low temperature of 30° C. or less, which is lower than an evaporation starting temperature of each material. The pre-heating time is preferably set to be 12 hours or more. The pre-heating is performed to remove moisture attached to each evaporation material.

Next, after vacuum evacuation of the substrate/mask stock chamber 102, masks are delivered to each evaporation chamber. After completion of the above described preparation, a substrate is delivered to the pretreatment chamber 103. In the pretreatment chamber 103, the substrate is heated in vacuum or under reduced pressure by a lamp heater or the like. Note that the substrate may be heated in the substrate/mask stock chamber 102.

Subsequently, the substrate is transported to the fourth evaporation chamber 110 through the delivery chamber 101 from the pretreatment chamber 103. After termination of alignment treatment using a mask and a CCD camera, a mixed layer is formed over the substrate. In the fourth evaporation chamber 110, an organic compound and metal oxide are evaporated from fixed evaporation sources to form the mixed layer on the substrate, which is set over the evaporation sources. During the evaporation, the substrate is rotated. This improves distribution of a thickness of the mixed film formed over the substrate.

Then, the substrate is delivered to the CVD chamber 107 through the delivery chamber 101 while the substrate is not exposed to a gas atmosphere including oxygen. The CVD chamber 107 is evacuated to be a high vacuum state until the substrate is delivered to the CVD chamber 107. After the delivery of the substrate, 1 to 500 sccm of high-purity nitrogen gas, in which the moisture content is reduced as much as possible, is supplied to the CVD chamber. When the CVD chamber is evacuated by a turbo booster pump during a period of supplying the nitrogen gas, pressure inside the CVD chamber is constant. The pressure is preferably $1 \times 10^{-1}$ to $1 \times 10^{6}$ Pa. After the nitrogen gas is sprayed to the substrate for 10 to 180 minutes and the substrate is exposed to the nitrogen gas, the supply of the nitrogen gas is stopped.

Alternatively, after the nitrogen gas is evacuated to made the CVD chamber in a high vacuum state, the nitrogen gas may be supplied to the CVD chamber again so that the substrate may be exposed to the nitrogen gas. Further, in a case where the substrate is not sprayed with the nitrogen gas, the nitrogen gas is supplied to the CVD chamber while keeping the above mentioned pressure so that the substrate may be exposed to a nitrogen gas atmosphere for 1 to 24 hours.

Note that in the CVD chamber 107, a CVD film can be formed over an entire surface of the substrate. Further, plasma treatment can be performed by using plural kinds of gases. By utilizing the plasma treatment, for example, a protection film such as a silicon nitride film or a silicon oxide film can be formed over a cathode. Furthermore, as pretreatment to the substrate, plasma treatment using plural kinds of gases (for example, $Ar+O_2$ plasma treatment) may be performed.

Next, the substrate is delivered to the second evaporation chamber 105 through the delivery chamber 101 without exposing the mixed layer to a gas atmosphere including oxygen. After termination of alignment treatment, a hole transporting layer is formed.

Then, the substrate is delivered to the first evaporation chamber 104 through the delivery chamber 101. A mechanism and a film formation method of the first evaporation chamber is the same as the other evaporation chambers. In the first evaporation chamber 104, a light emitting layer is formed, and then an electron transporting layer is formed. The light emitting layer may be formed by co-evaporation of a host material and a dopant material. The switching of the formation of the electron transporting layer from the formation of the light emitting layer is smoothly carried out only by closing an evaporation source shutter attached to each evaporation source.

Next, the substrate is delivered to the third evaporation chamber 106 through the delivery chamber 101. In the third evaporation chamber 106, a cathode is formed. A mechanism and a film formation method of the third evaporation chamber is the same as the other evaporation chambers.

The substrate subjected to necessary treatment as described above is carried back to the substrate/mask stock chamber 102, which is a starting point, again through the delivery chamber 101. A series of treatment required for obtaining a panel, which emits light with a single color, is shown in this embodiment mode; however, the present invention is not limited thereto.

After termination of the same treatment with respect to all of loaded substrates and masks are collected to the substrate/mask stock chamber 102 from each evaporation chamber, the evaporation mode is terminated, and then a sealing mode starts successively in this manufacturing apparatus.

The sealing mode will be described below. First, the delivery chamber 101, the substrate/mask stock chamber 102, and the sealing glass stock chamber 108 are pressurized with nitrogen gas to have atmospheric pressure. This treatment may be performed to the delivery chamber and the substrate/mask stock chamber immediately after the termination of the evaporation mode. Further, with respect to the sealing glass stock chamber, when a counter substrate, which is subjected to the pretreatment, is set immediately before sealing as much as possible, deterioration of a sealing material and a drying material can be inhibited. After setting the counter substrate, a concentration of moisture of the delivery chamber in a sealing mode can be reduced by performing plural times of pressurizing treatment to the sealing glass stock chamber by evacuation of the sealing glass stock chamber and pressurization treatment with nitrogen gas. Further, defoaming of the sealing material formed over the counter substrate can be performed.

Next, the substrate is delivered to the sealing chamber 109 from the substrate/mask stock chamber 102 through the delivery chamber 101 whereas the counter substrate is delivered to the sealing chamber 109 from the sealing glass stock chamber 108 through the delivery chamber 101. In the sealing chamber, after terminating alignment treatment of the substrate and the counter substrate such that the edge portions of the substrate and the counter substrate are adjusted, the substrate and the counter substrate are attached to each other and pressurized to perform sealing. Further, ultraviolet ray irradiation is performed from the side (lower side) of the counter substrate to cure the sealing material (which is a ultraviolet curing resin here). At this moment, by using a light shielding mask, only a portion of the sealing material can be selectively irradiated with ultraviolet ray.

Through the above described sealing treatment, the substrate and the counter substrate becomes one panel. This panel is delivered to the substrate/mask stock chamber 102 from the sealing chamber 109 through the delivery chamber 101. Subsequently, other substrates and other counter substrates are subjected to the same treatment. Panels are ultimately stocked in the substrate/mask stock chamber, and then the sealing mode is terminated. After the termination of the sealing mode, the completed panels may be taken out from the substrate/mask stock chamber.

Embodiment Mode 7

In this embodiment mode, a light emitting device of the present invention will be described while showing a method for manufacturing the light emitting device with reference to FIGS. 10A to 10E and FIGS. 11A to 11C. Note that an example of manufacturing an active matrix light emitting device will be described in this embodiment mode.

First, a first base insulating layer 51a and a second base insulating layer 51b are formed over a substrate 50, and then, a semiconductor layer is formed over the second base insulating layer 51b (FIG. 10A).

As the substrate 50, glass, quartz, plastic (such as polyimide, acrylic, polyethyleneterephthalate, polycarbonate, polyacrylate, and polyethersulfone), and the like can be used. A substrate made from such a material can be polished by CMP or the like, if required. In this embodiment mode, a glass substrate is used.

The first base insulating layer 51a and the second base insulating layer 51b are provided to prevent an element such as alkali metal and alkali earth metal, which adversely affects a characteristic of the semiconductor layer from dispersing in the semiconductor layer. As materials of the first and second base insulating layers, silicon oxide, silicon nitride, silicon oxide containing nitrogen, silicon nitride containing oxygen, and the like can be used. In this embodiment mode, the first base insulating layer 51a is formed using silicon nitride and the second base insulating layer 51b is formed using silicon oxide. A base insulating film including two layers of the first base insulating layer 51a and the second base insulating layer 51b is provided in this embodiment mode. Alternatively, a base insulating film including a single layer or two or more layers may be provided. Further, if dispersion of an impurity penetrating from the substrate causes no problems, the base insulating layers are not necessary to be provided.

In this embodiment mode, the semiconductor layer formed after the first and second base insulating layers are obtained by crystallizing an amorphous silicon film by laser beam. The amorphous silicon film is formed over the second base insulating layer 51b to have a thickness of 25 to 100 nm (preferably, 30 to 60 nm). As a method for forming the amorphous silicon film, a known method such as sputtering, reduced pressure CVD, and plasma CVD, can be used. Thereafter, heat treatment is performed at 500° C. for one hour to perform dehydrogenation.

Subsequently, the amorphous silicon film is crystallized by using a laser irradiation apparatus to form a crystalline silicon film. In this embodiment mode, an excimer laser is used in laser crystallization. Laser beam oscillated from the laser irradiation apparatus is processed into a linear beam spot by using an optical system. The amorphous silicon film is crystallized by being irradiated with the linear beam spot. The thus obtained crystalline silicon film is used as the semiconductor layer.

As other method for crystallizing an amorphous silicon film, there are a method by which crystallization is performed only by heat treatment, and a method by which crystallization is performed by heat treatment with use of a catalytic element promoting crystallization. As an element promoting crystallization, nickel, iron, palladium, tin, lead, cobalt, platinum, copper, gold, and the like can be given. When using such an element promoting crystallization, the crystallization can be carried out at a lower temperature and a shorter time as compared to a case of performing crystallization only by heat treatment. Therefore, the glass substrate and the like are less damaged by the crystallization. When crystallization is performed only by heat treatment, a quartz substrate, which is resistant to heat, may be used as the substrate 50.

Subsequently, a minute amount of impurity is doped in the semiconductor layer so as to control a threshold value, or, channel doping is performed, if required. To obtain a required threshold value, an impurity (such as phosphorus and boron) imparting an N-type conductivity or a P-type conductivity is doped in the semiconductor layer by ion doping or the like.

Thereafter, as shown in FIG. 10A, the semiconductor layer is patterned into a predetermined shape to obtain an island-like semiconductor layer 52. This patterning is performed in such a way that a photoresist is formed over the semiconductor layer, a predetermined mask shape is exposed and baked to form a resist mask over the semiconductor layer, and the semiconductor layer is etched by utilizing the resist mask.

Subsequently, a gate insulating layer 53 is formed to cover the semiconductor layer 52. The gate insulating layer 53 is formed using an insulating layer containing silicon by plasma CVD or sputtering so as to have a thickness of 40 to 150 nm. In this embodiment mode, silicon oxide is used to form the gate insulating layer 53.

Next, a gate electrode 54 is formed over the gate insulating layer 53. The gate electrode 54 may be formed by using an element selected from tantalum, tungsten, titanium, molybdenum, aluminum, copper, chromium, and niobium; or an alloy material or a compound material mainly containing these elements. Further, a semiconductor film typified by a polycrystalline silicon film doped with an impurity element such as phosphorus may be used. Furthermore, an AgPdCu alloy may be used.

In this embodiment mode, the gate electrode 54 is formed to have a single layer. Alternatively, the gate electrode 54 may have a stacked structure including two or more layers, for example, a lower layer made from tungsten and an upper layer made from molybdenum. In a case where the gate electrode is formed to have a stacked structure, the above mentioned materials may be used. Further, a combination of these materials may be arbitrarily selected. The gate electrode 54 is etched by utilizing a mask made from a photoresist.

Subsequently, a high concentration impurity is doped into the semiconductor layer 52 while utilizing the gate electrode 54 as a mask. Thus, a thin film transistor 70 including the semiconductor layer 52, the gate insulating layer 53, and the gate electrode 54, is formed. In this case, an LDD region 57 may be provided by using low-speed ion doping or high-speed ion doping in addition to a source region 55 and a drain region 56.

Note that processes of manufacturing the thin film transistor are not particularly limited, and may be arbitrarily changed so as to manufacture a transistor having a desired structure.

In this embodiment mode, a top-gate thin film transistor using the crystalline silicon film, which is crystallized by laser crystallization, is used. Alternatively, a bottom-gate thin film transistor using an amorphous semiconductor film can be used. The amorphous semiconductor film can be formed by using not only silicon but also silicon germanium. When using silicon germanium, a concentration of germanium is preferably set to be about 0.01 to 4.5 atomic %.

Further, a microcrystalline semiconductor film (semiamorphous semiconductor) in which 0.5 to 20 nm crystal grains can be observed in an amorphous semiconductor, may be used. Fine crystals, in which 0.5 to 20 nm crystal grains can be observed, are also referred to as microcrystals (μc).

Semiamorphous silicon (also referred to as SAS), which is a semiamorphous semiconductor, can be obtained by glow discharge decomposition of silane-based gas. As typical silane-based gas, $SiH_4$ can be given, and in addition, $Si_2H_6$, $SiH_2Cl_2$, $SiHCl_3$, $SiCl_4$, $SiF_4$ and the like can be used. By diluting such silane-based gas with hydrogen or a mixture of hydrogen and one or more rare gas elements selected from helium, argon, krypton, and neon, the SAS can be formed easily. The dilution ratio of the silane-based gas is preferably set to be in the range of 1:10 to 1:1,000. The semiamorphous silicon may be formed by glow discharge decomposition at the pressure of about 0.1 to 133 Pa. The high-frequency power for glow discharge is preferably set to be 1 to 120 MHz, and more preferably, 13 to 60 MHz. A substrate heating temperature may be set to be 300° C. or less, and preferably, 100 to 250° C.

Raman spectrum of the thus formed SAS is shifted toward lower wavenumbers than 520 cm$^{-1}$. The diffraction peaks of (111) and (220), which are believed to be derived from Si crystal lattice, are observed in the SAS by X-ray diffraction. The semiamorphous semiconductor contains hydrogen or halogen of at least 1 atomic % or more to terminate dangling bonds. With respect to impurity elements contained in the film, each concentration of impurities for atmospheric constituents such as oxygen, nitrogen, and carbon is preferably set to be $1\times10^{20}$ cm$^{-3}$ or less. In particular, the oxygen concentration is set to be $5\times10^{19}$ cm$^{-3}$ or less, and preferably, $1\times10^{19}$ cm$^{-3}$ or less.

Moreover, the SAS may be further crystallized by laser irradiation.

Subsequently, an insulating film (hydrogenated film) 59 is formed by using silicon nitride so as to cover the gate electrode 54 and the gate insulating layer 53. The insulating film (hydrogenated film) 59 is heated at 480° C. for about 1 hour to activate the impurity element and hydrogenate the semiconductor layer 52.

A first interlayer insulating layer 60 is formed to cover the insulating film (hydrogenated film) 59. As a material for forming the first interlayer insulating layer 60, silicon oxide, acrylic, polyimide, siloxane, a low dielectric constant material, and the like may be used. In this embodiment mode, a silicon oxide film is formed as the first interlayer insulating layer (FIG. 10B).

Next, contact holes that reach the semiconductor layer 52 are formed. The contact holes can be formed using a resist mask by etching to expose the semiconductor layer 52 through the contact holes. The contact holes can be formed by either wet etching or dry etching. Further, they may be formed by etching one or more times depending on a condition. When etching is performed plural times, both wet etching and dry etching may be used (FIG. 10C).

A conductive layer is formed to cover the contact holes and the first interlayer insulating layer 60. This conductive layer is processed into a desired shape to form a connection portion 61a, a wiring 61b, and the like. This wiring may have a single layer made from aluminum, copper, an aluminum-carbon-nickel alloy, an aluminum-carbon-molybdenum alloy, or the like. Further, the wiring may have a structure formed by stacking molybdenum, aluminum, and molybdenum from the side of a substrate, a structure formed by stacking titanium, aluminum, and titanium from the side of a substrate, or a structure formed by stacking titanium, titanium nitride, aluminum, and titanium from the side of a substrate (FIG. 10D).

Thereafter, a second interlayer insulating layer 63 is formed to cover the connection portion 61a, the wiring 61b, and the first interlayer insulating layer 60. As a material of the second interlayer insulating layer 63, a film having a self-planarizing property such as acrylic, polyimide, and siloxane is preferably used. In this embodiment mode, siloxane is used to form the second interlayer insulating layer 63 (FIG. 10E).

Subsequently, an insulating layer may be formed using silicon nitride or the like over the second interlayer insulating layer 63 (not shown). This insulating layer is formed to prevent the second interlayer insulating layer 63 from being etched more than necessary in etching a pixel electrode that will be formed later. Therefore, when a ratio of the etching rates between the pixel electrode and the second interlayer insulating layer 63 is large, this insulating layer may not be provided. Next, a contact hole is formed through the second interlayer insulating layer 63 to reach the connection portion 61*a*.

A conductive layer having a light transmitting property is formed to cover the contact hole and the second interlayer insulating layer 63 (or the insulating layer). Thereafter, the conductive layer having the light transmitting property is processed to form an anode 64. The anode 64 is electrically connected to the connection portion 61*a* here.

The anode 64 can be formed by using a conductive film shown in Embodiment Mode 1, for example, metal having a conducting property such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), and titanium (Ti); an alloy thereof such as aluminum-silicon (Al—Si), aluminum-titanium (Al—Ti), and aluminum-silicon-copper (Al—Si—Cu); nitride of a metal material such as titanium nitride (TiN); a metal compound such as ITO, ITO containing silicon oxide (ITSO), and IZO.

Figure 11A:
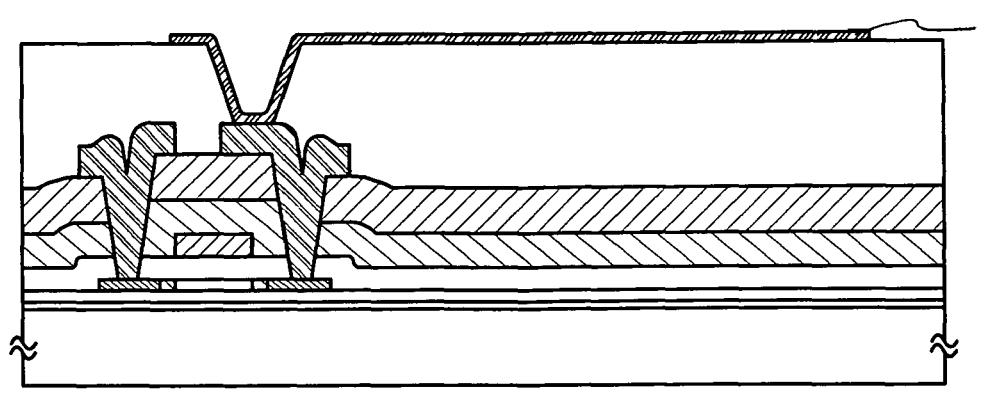
FIGS. 11A to 11C are cross sectional views explaining a method for manufacturing a light emitting device of the present invention.

Further, an electrode through which light is extracted may be formed using a conductive film having a light transmitting property. An extremely thin film of metal such as Al and Ag is used, in addition to a metal compound such as ITO, ITSO, or IZO. Furthermore, in a case where light is extracted through a cathode, the anode can be formed using a material having high reflectance (e.g., Al, Ag, or the like). In this embodiment mode, the anode 64 is formed by using ITSO (FIG. 11A).

Figure 11B:
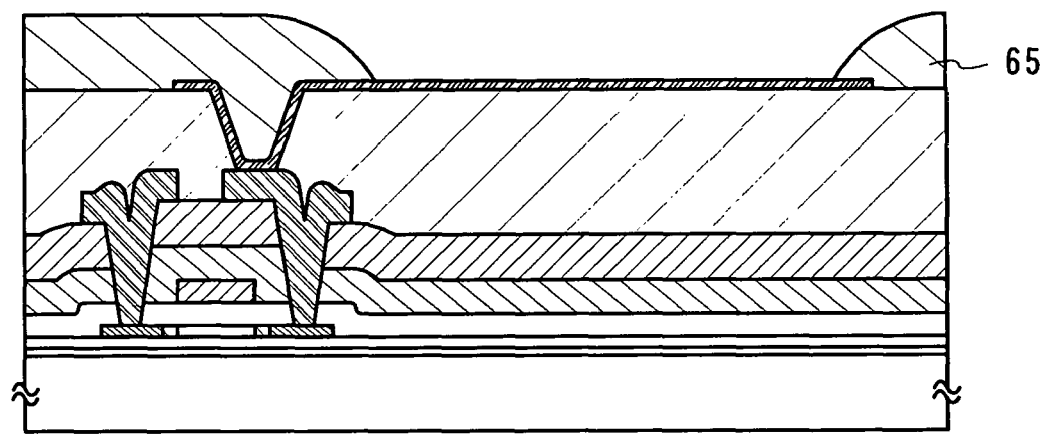

Next, an insulating layer is formed using an organic material or an inorganic material to cover the second interlayer insulating layer 63 (or the insulating layer) and the anode 64. Subsequently, the insulating layer is processed to expose a part of the anode 64 so as to form a partition wall 65. A photosensitive organic material (such as acrylic and polyimide) is preferably used as a material of the partition wall 65. In addition, the partition wall may be formed using a nonphotosensitive organic or inorganic material. Further, a black pigment such as titanium black and carbon nitride or a dye may be dispersed in a material of the partition wall 65 by using a dispersant so that the partition wall 65 may be used as a black matrix. Preferably, an edge of the partition wall 65, where faces the anode, has a taper shape such that the curvature is continuously varied (FIG. 11B). Thereafter, the substrate is heated in vacuum or under reduced pressure to remove moisture and the like.

Subsequently, a mixed layer including an organic compound and metal oxide is formed in vacuum or under reduced pressure to cover the anode 64 exposed from the partition wall 65. This mixed layer has a structure described in Embodiment Mode 1. In this embodiment mode, DNTPD is used as the organic compound whereas molybdenum trioxide is used as the metal oxide. The mixed layer is formed by co-evaporation such that a weight ratio of molybdenum trioxide to DNTPD is 10 to 80 wt %. Of course, the mixed layer may be formed by using other materials described in Embodiment Mode 1.

Thereafter, the mixed layer is exposed to a nitrogen gas atmosphere at a room temperature without being exposed to a gas atmosphere including oxygen in accordance with the method shown in the above embodiment modes. Nitrogen gas is introduced into a chamber in which the substrate is set. Moisture is desirably removed as much as possible from the nitrogen gas in the same manner as the above embodiment modes.

Subsequently, a layer having an excellent hole transporting property, a light emitting layer, and an electron transporting layer are formed in vacuum or under reduced pressure without exposing the mixed layer to a gas atmosphere including oxygen. The layer having the excellent hole transporting property is formed using NPB by evaporation to have a thickness of 10 to 100 nm. The light emitting layer is formed by co-evaporation of $Alq_3$ and coumarin 6 to have a thickness of 35 to 100 nm such that a weight ratio between $Alq_3$ and coumarin 6 is set to be 1:0.005. The electron transporting layer is formed using $Alq_3$ by evaporation to have a thickness of 10 to 100 nm. Accordingly, a light emitting stacked body 66 including the mixed layer, the hole transporting layer, the light emitting layer, and the electron transporting layer is formed over the anode 64.

Figure 11C:
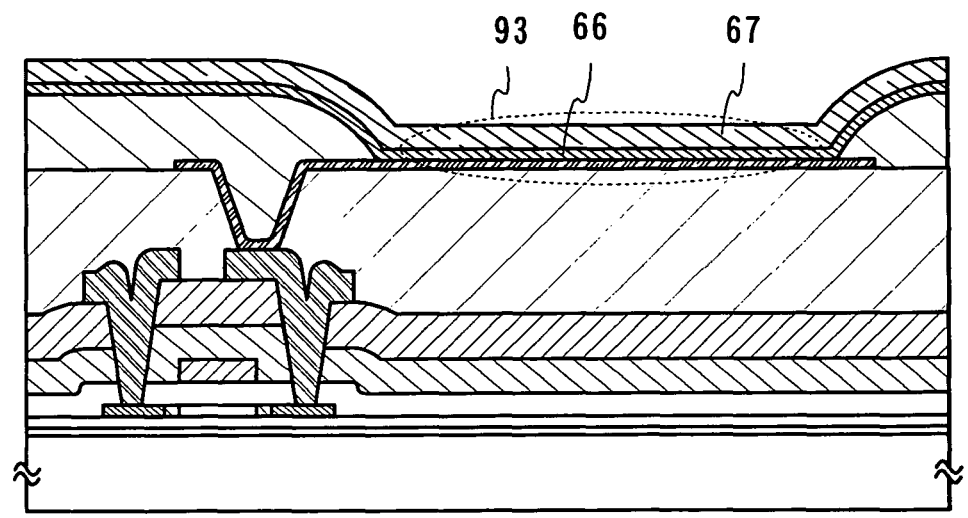

A cathode 67 is next formed to cover the light emitting stacked body 66 (FIG. 11C). A light emitting device 93 in which an organic layer including the light emitting layer is interposed between the anode 64 and the cathode 67 can be manufactured. By applying higher voltage to the anode 64 than the cathode 67, light emission can be obtained. As an electrode material used for forming the cathode 67, the same material used for forming the anode can be used. In this embodiment mode, the cathode is formed using aluminum. Thus, a light emitting device is completed.

Afterwards, a silicon oxide film containing nitrogen is formed as a passivation film by plasma CVD. When using a silicon oxide film containing nitrogen, a silicon oxynitride film may be formed using $SiH_4$, $N_2O$, and $NH_3$ by plasma CVD, or a silicon oxynitride film may be formed using $SiH_4$ and $N_2O$ by plasma CVD, or a silicon oxynitride film may be formed using a gas in which $SiH_4$ and $N_2O$ are diluted with Ar, by plasma CVD.

Alternatively, as the passivation film, a hydrogenated silicon oxynitride film formed using $SiH_4$, $N_2O$, and $H_2$ by plasma CVD may be used. The passivation film is, of course, not limited to a single layer structure, and it may have a single layer structure or a stacked structure of other insulating layer containing silicon. In addition, a multilayer film including a carbon nitride film and a silicon nitride film, a multilayer film including styrene polymer, a silicon nitride film, or a diamond like carbon film may be formed instead of the silicon oxide film containing nitrogen.

Subsequently, to protect the light emitting device from a substance which promotes deterioration of the light emitting device such as moisture, a display portion is sealed. When the display portion is sealed with a counter substrate, the counter substrate is attached to the display portion with an insulating sealing material such that an external connection portion is exposed. A space between the counter substrate and the element substrate may be filled with an inert gas such as dried nitrogen. Alternatively, a sealing material may be applied over the entire surface of the pixel portion and then the counter substrate may be attached thereto. An ultraviolet curing resin or the like is preferably used as the sealing material. A drying agent or a particle for maintaining a constant gap between the substrates may be mixed in the sealing material. Subsequently, a flexible wiring substrate is attached to the external connection portion.

Examples of structures of the light emitting device formed above will be described with reference to FIGS. 12A and 12B. Further, portions having similar functions are sometimes denoted by same reference numerals, though they have different shapes so as to omit explanation. In this embodiment mode, the thin film transistor 70 having an LDD structure is connected to the light emitting device 93 through the connection portion 61*a*.

Figure 12A:
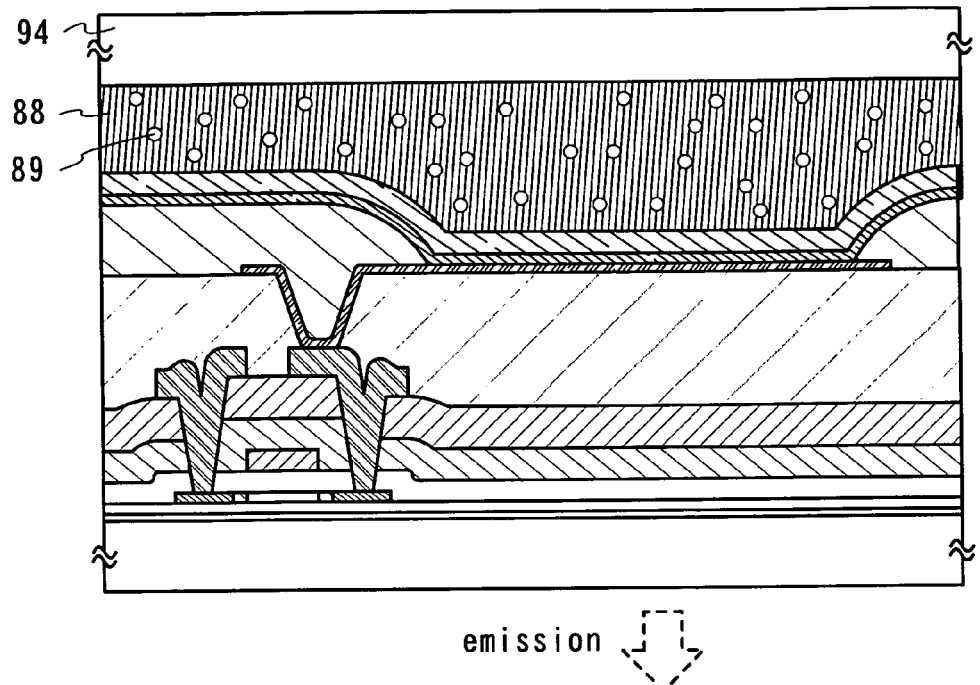
FIGS. 12A and 12B are cross sectional views explaining a light emitting device.

FIG. 12A shows a structure where the anode 64 is formed using a conductive film having a light transmitting property, and light generated in the light emitting stacked body 66 is emitted toward the substrate 50. Further, reference numeral 94 represents a counter substrate. After forming the light emitting device 93 over the substrate 50, the counter substrate is firmly attached to the substrate 50 using a sealing material or the like. A space between the counter substrate 94 and the light emitting device 93 is filled with a resin 88 having a light transmitting property or the like to seal the light emitting element. Accordingly, the light emitting device 93 can be prevented from being deteriorated by moisture or the like. Preferably, the resin 88 has a hygroscopic property. More preferably, to prevent the adverse influence of moisture, a drying agent 89 with a high light transmitting property is dispersed in the resin 88.

Figure 12B:
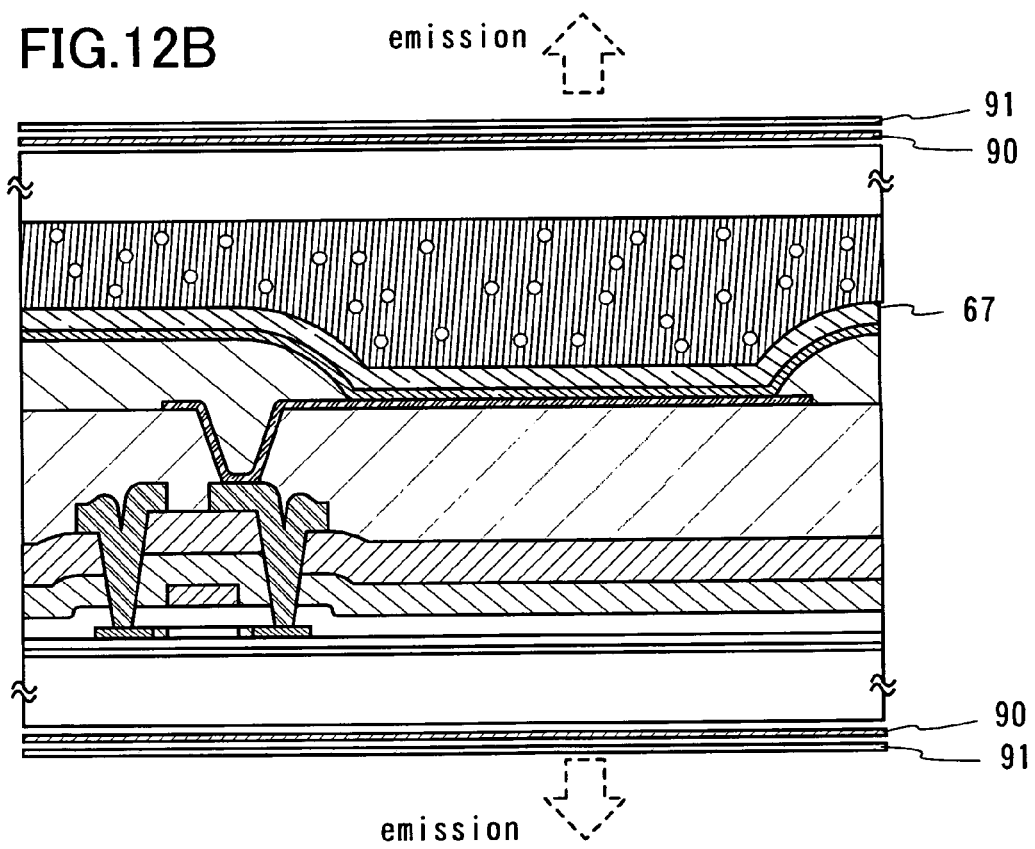

FIG. 12B shows a structure where both the anode 64 and the cathode 67 are formed using conductive films having light transmitting properties and light can be emitted toward both the substrate 50 and the counter substrate 94. In this structure, by providing polarizing plates 90 outside of the substrate 50 and the counter substrate 94, a screen can be prevented from being transparent, thereby improving visibility. Protection films 91 are preferably provided outside of the polarizing plates 90.

Figure 13:
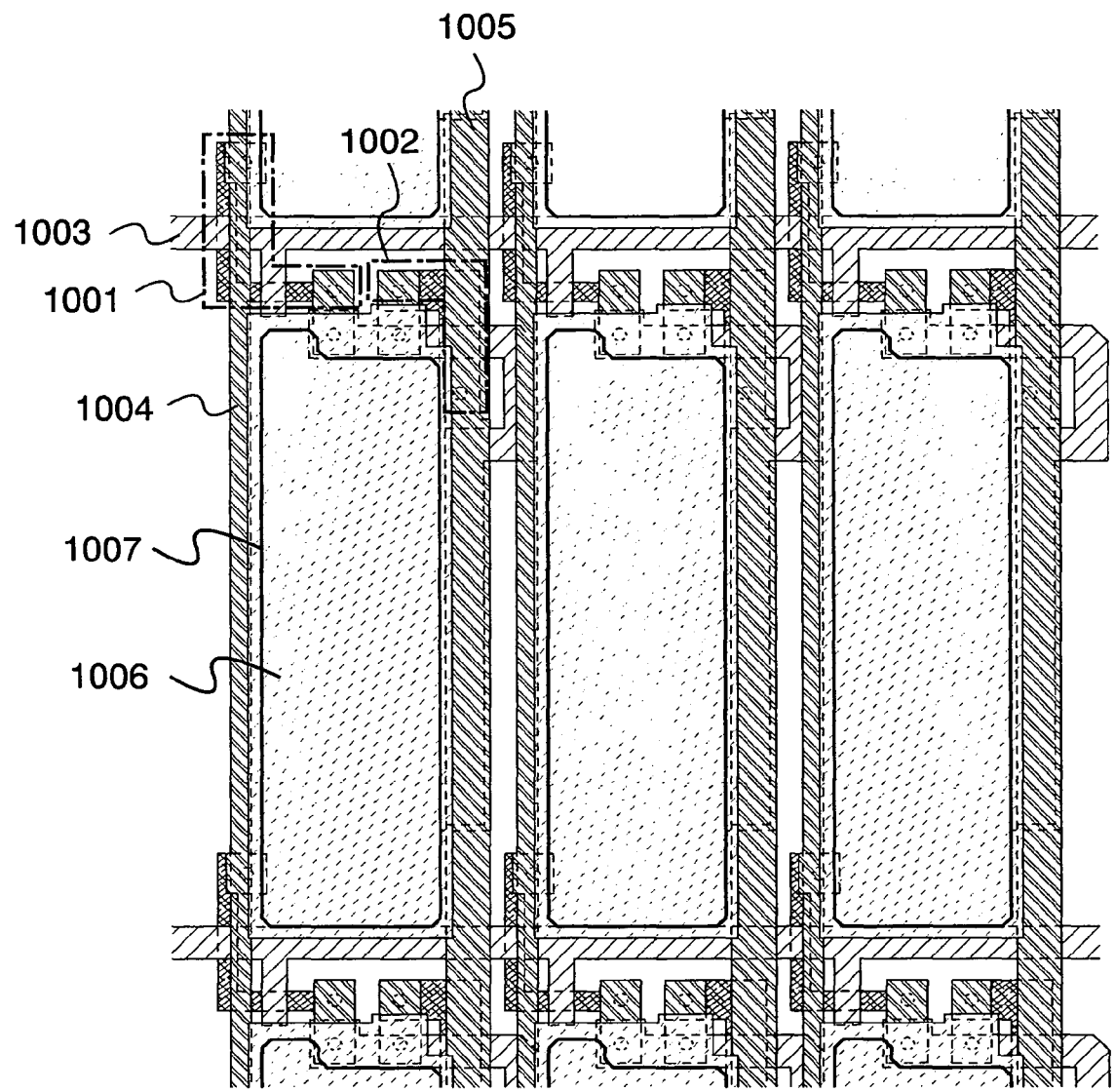
FIG. 13 is a diagram explaining a pixel portion of a light emitting device.

Further, arrangements of a transistor, a light emitting device, and the like are not particularly limited. For example, they can be arranged as shown in a top view of FIG. 13. In FIG. 13, a first electrode of a first transistor 1001 is connected to a source signal line 1004 and a second electrode is connected to a gate electrode of a second transistor 1002. A first electrode of the second transistor is connected to a power supply line 1005, and a second electrode of the second transistor is connected to an electrode 1006 of a light emitting element. A part of a gate signal line 1003 serves as a gate electrode of the first transistor 1001.

The light emitting device according to the present invention with a display function may employ either analog video signals or digital video signals. When using the digital video signals, light emitting display devices are classified into one in which the video signals use voltage and one in which the video signals use current. When light emitting devices emit light, video signals input in pixels are classified into one at constant voltage and one at constant current. The video signals at constant voltage include one in which constant voltage is applied to a light emitting device and one in which constant current flows through a light emitting device. The video signals at constant current include one in which constant voltage is applied to a light emitting device and one in which constant current flows though a light emitting device. The case where constant voltage is applied to a light emitting device indicates a constant voltage drive whereas the case where constant current flows though a light emitting device indicates a constant current drive. In the constant current drive, constant current flows regardless of the change in resistance of a light emitting device. The light emitting device of the present invention and a method for driving the light emitting device may use either a driving method utilizing voltage of video signals or a driving method utilizing current of video signals. Furthermore, either the constant voltage drive or the constant current drive may be used.

The life of the light emitting device of the present invention manufactured in accordance with the above described manufacturing method, is prolonged without deteriorating a characteristic thereof. Moreover, the present embodiment mode can be implemented by being freely combined with any structure of the above described embodiment modes.

Embodiment Mode 8

Figure 14A:
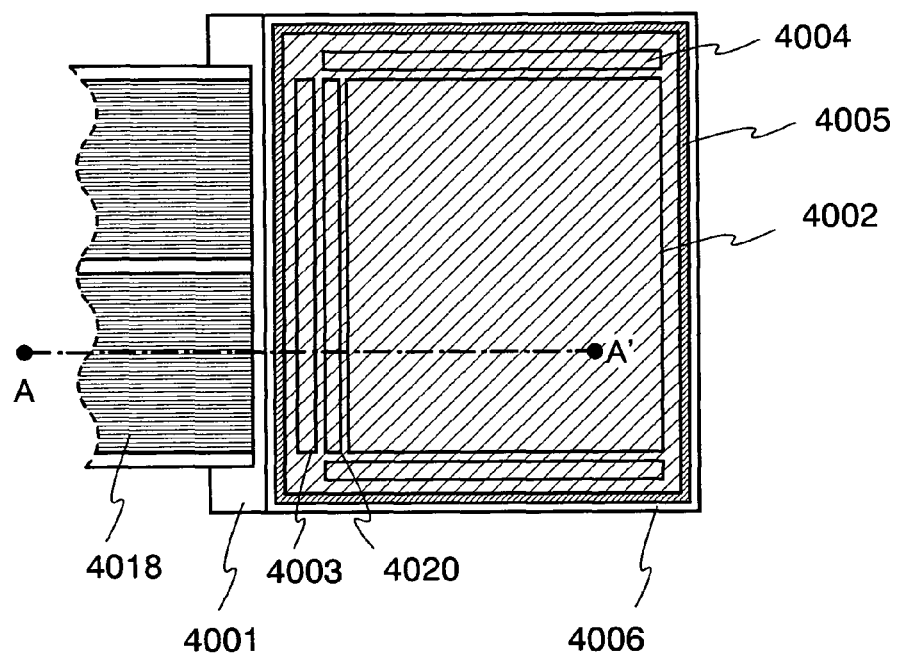
FIG. 14A is a top view and FIG. 14B is a cross sectional view explaining a light emitting device.
Figure 14B:
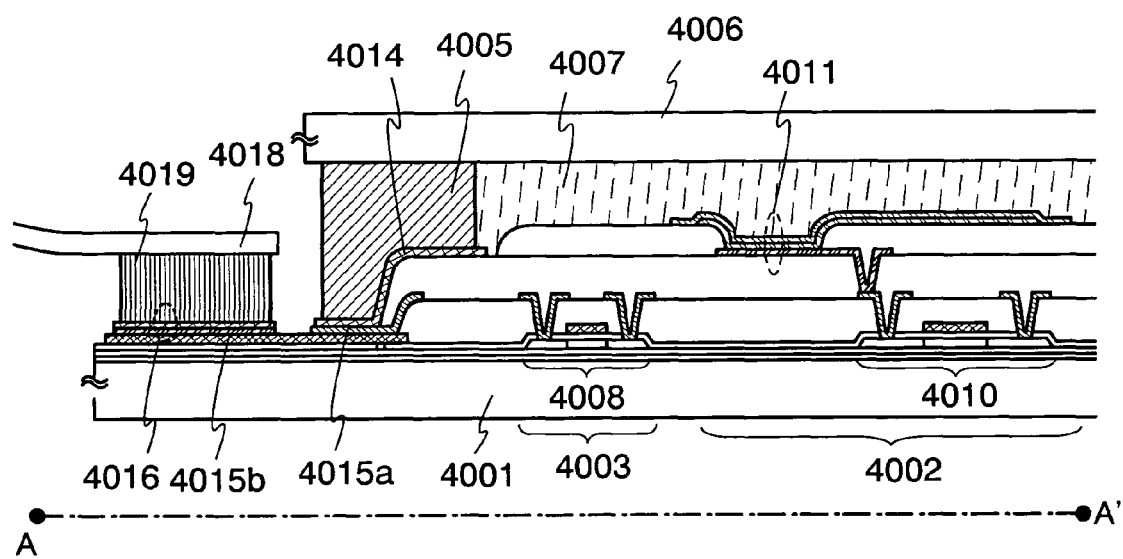

An outer appearance of a panel which is a light emitting device of the present invention, will be described in this embodiment mode with reference to FIGS. 14A and 14B. FIG. 14A is a top view of a panel in which a transistor and a light emitting element formed over a substrate are sealed with a sealing material that is formed between the substrate and a counter substrate 4006. FIG. 14B is a cross sectional view along a line A-A' of FIG. 14A. The light emitting device mounted on this panel has a structure as shown in Embodiment Mode 7.

A sealing material 4005 is provided so as to surround a pixel portion 4002, a signal line driver circuit 4003, and a scanning line driver circuit 4004 that are provided over a substrate 4001. The counter substrate 4006 is provided over the pixel portion 4002, the signal line driver circuit 4003, and the scanning line driver circuit 4004. Thus, the pixel portion 4002, the signal line driver circuit 4003, and the scanning line driver circuit 4004 are hermetically sealed with the substrate 4001, the sealing material 4005, and the counter substrate 4006 along with a filler 4007.

The pixel portion 4002, the signal line driver circuit 4003, and the scanning line driver circuit 4004, which are provided over the substrate 4001, have a plurality of thin film transistors. In FIG. 14B, a thin film transistor 4008 included in the signal line driver circuit 4003 and a thin film transistor 4010 included in the pixel portion 4002 are shown.

Further, a light emitting device 4011 is electrically connected to the thin film transistor 4010.

Also, a leading wiring 4014 corresponds to a wiring for supplying signals or power supply voltage to the pixel portion 4002, the signal line driver circuit 4003, and the scanning line driver circuit 4004. The leading wiring 4014 is connected to a connection terminal 4016 through a leading wiring 4015a and a leading wiring 4015b. The connection terminal 4016 is electrically connected to a terminal included in a flexible printed circuit (FPC) 4018 through an anisotropic conductive film 4019.

Further, as the filler 4007, an ultraviolet curing resin or a heat curing resin can be used in addition to an inert gas such as nitrogen and argon. For example, polyvinyl chloride, acrylic, polyimide, an epoxy resin, a silicon resin, polyvinyl butyral, or ethylene vinylene acetate can be used.

Furthermore, a light emitting device of the present invention includes a panel in which a pixel portion having a light emitting device is formed and a module in which an IC is mounted on the panel.

In the light emitting device having such a structure, generation of dark spots can be suppressed without increasing driving voltage and power consumption.

This embodiment mode can be implemented by being combined with the above embodiment modes.

Embodiment Mode 9

Pixel circuits and protection circuits included in the panel and module described in Embodiment Mode 8, and operations thereof will be described in this embodiment mode. Further, the cross sectional views as shown in FIGS. 10A to 10E and FIGS. 11A to 11C correspond to cross sectional views of a driving TFT 1403 and a light emitting device 1405.

Figure 15A:
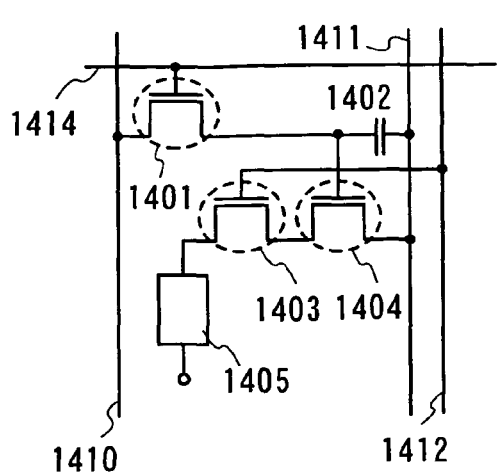
FIGS. 15A to 15F are diagrams explaining pixel circuits of a light emitting device.

In a pixel as shown in FIG. 15A, a signal line 1410, power supply lines 1411 and 1412 are arranged in columns, whereas a scanning line 1414 is arranged in a row. The pixel also includes a switching TFT 1401, a driving TFT 1403, a current controlling TFT 1404, a capacitor element 1402, and a light emitting device 1405.

Figure 15B:
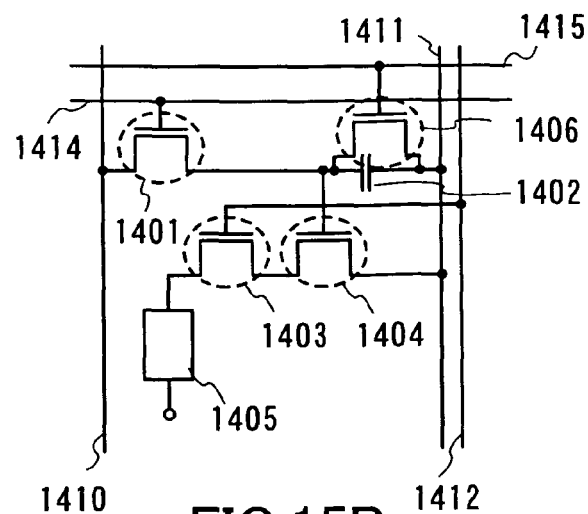
Figure 15C:
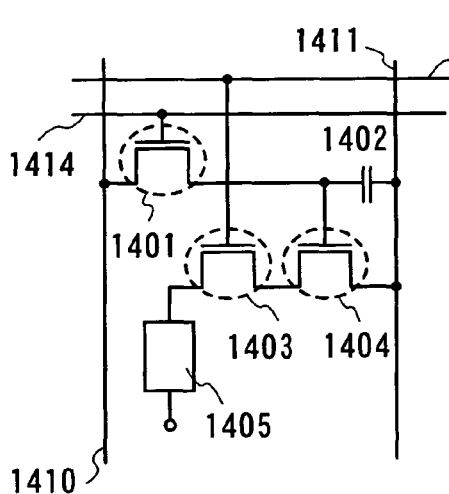

A pixel as shown in FIG. 15C has a similar structure to the one shown in FIG. 15A, except that a gate electrode of the driving TFT 1403 is connected to a power supply line 1412 that is arranged in a row. That is, both pixels depicted in FIGS. 15A and 15C show similar equivalent circuit diagrams. However, respective power supply lines are formed of conductive films in different layers between the case where the power supply line 1412 is arranged in a column (FIG. 15A) and the case where the power supply line 1412 is arranged in a row (FIG. 15C). In order to emphasis on the different arrangements of the power supply lines to which the gate electrodes of the driving TFTs 1403 are connected, the equivalent circuit diagrams are individually illustrated in FIGS. 15A and 15C.

In each pixel as shown in FIGS. 15A and 15C, the driving TFT 1403 and the current controlling TFT 1404 are connected in series in each pixel, and the channel length L(1403) and the channel width W(1403) of the driving TFT 1403 and the channel length L(1404) and the channel width W(1404) of the current controlling TFT 1404 may be set to satisfy the relation of L(1403)/W(1403):L(1404)/W(1404)=5 to 6,000: 1.

The driving TFT 1403 is operated in a saturation region and controls the amount of current flowing through the light emitting element 1405, whereas the current controlling TFT 1404 is operated in a linear region and controls current supplied to the light emitting device 1405. The both TFTs 1403 and 1404 preferably have a same conductivity type in view of the manufacturing process, and n-channel TFTs are formed as the TFTs 1403 and 1404 in this embodiment mode. Also, a depletion type TFT may be used as the driving TFT 1403 instead of an enhancement type TFT. In a light emitting device of the present invention having the above structure, slight variations in $V_{gs}$ of the current controlling TFT 1404 does not adversely affect the amount of current flowing through the light emitting device 1405, since the current controlling TFT 1404 is operated in the linear region. That is, the amount of current flowing through the light emitting device 1405 can be determined by the driving TFT 1403 operated in the saturation region. In accordance with the above described structure, it is possible to provide a light emitting device in which image quality is improved by improving variations in luminance of a light emitting element due to variation of the TFT characteristics.

The switching TFT 1401 of each pixel as shown in FIGS. 15A to 15D controls a video signal input with respect to the pixel. When the switching TFT 1401 is turned on and a video signal is input in the pixel, a voltage of the video signal is held in the capacitor element 1402. Although the arrangement in which each pixel includes the capacitor element 1402 are shown in FIGS. 15A and 15C, the present invention is not limited thereto. When a gate capacitor or the like can serve as a capacitor for holding a video signal, the capacitor element 1402 may not be provided.

Figure 15D:
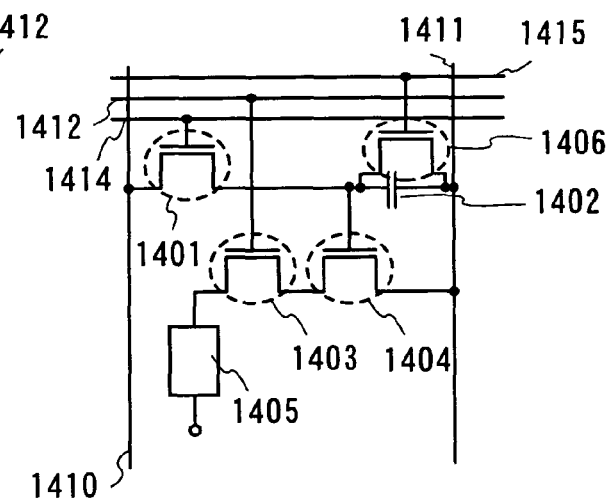

A pixel as shown in FIG. 15B has a similar structure to the one shown in FIG. 15A, except that a TFT 1406 and a scanning line 1415 are added thereto. Similarly, a pixel as shown in FIG. 15D has a similar structure to the one shown in FIG. 15C, except that a TFT 1406 and a scanning line 1415 are added thereto.

The TFT 1406 is controlled to be turned on/off by the newly provided scanning line 1415. When the TFT 1406 is turned on, the charge held in the capacitor element 1402 is discharged, thereby turning the current controlling TFT 1404 off. That is, supply of current flowing through the light emitting element 1405 can be forcibly stopped by providing the TFT 1406. Therefore, the TFT 1406 can also referred to as an erasing TFT. A lighting period can start simultaneously with or immediately after a writing period starts before signals are written into all the pixels in accordance with the structures shown in FIGS. 15B and 15D, and hence, the duty ratio can be improved.

Figure 15E:
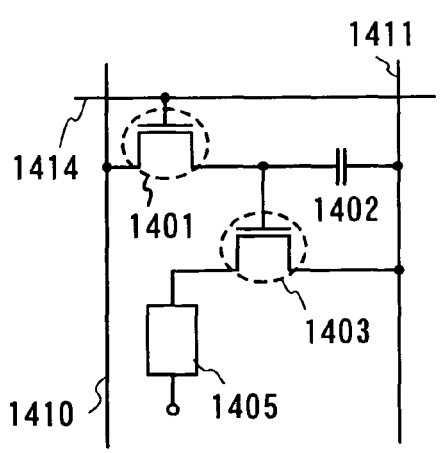
Figure 15F:
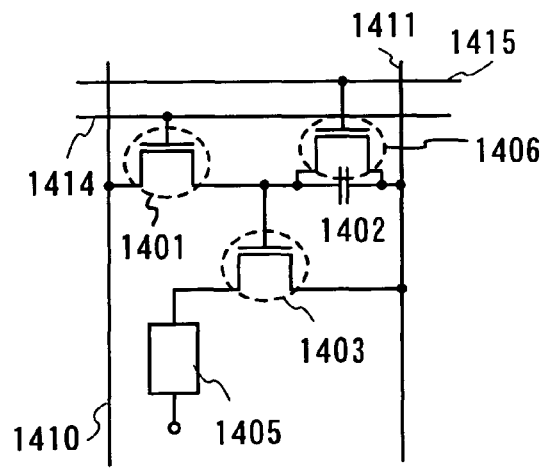

In a pixel as shown in FIG. 15E, a signal line 1410 and a power supply line 1411 are arranged in columns while a scanning line 1414 is arranged in a row. The pixel further includes a switching TFT 1401, a driving TFT 1403, a capacitor element 1402, and a light emitting element 1405. A pixel shown in FIG. 15F has a similar structure to the one shown in FIG. 15E, except that a TFT 1406 and a scanning line 1415 are added thereto. Further, the structure as shown in FIG. 15F also allows a duty ratio to be improved by providing the TFT 1406.

As described above, various kinds of pixel circuits can be employed. In particular, when a thin film transistor is formed using an amorphous semiconductor film, an area of a semiconductor film of the driving TFT 1403 is preferably made large. Therefore, in the above pixel circuits, a top emission type in which light generated in the light emitting stacked body is emitted through a sealing substrate, is preferably employed.

It is thought that such an active matrix light emitting device is preferable when pixel density is increased since a TFT is provided for each pixel.

An active matrix light emitting device in which a TFT is provided in each pixel is described in this embodiment mode. However, a passive matrix light emitting device in which a TFT is provided for each column can be formed. Since a TFT is not provided in each pixel in the passive matrix light emitting device, high aperture ratio is obtained. In the case of a light emitting device in which light generated in a light emitting stacked body is emitted toward both sides of the light emitting stacked body, when a passive matrix light emitting device is employed, transmittance can be increased.

In a light emitting device of the present invention further having such pixel circuits, a material, which is suitable for a structure and a performance to be required of the light emitting device, can be used as an electrode of the light emitting device. In addition, the light emitting device can have the above described characteristics.

Subsequently, a case in which diodes are provided as protection circuits in a scanning line and a signal line, will be described using an equivalent circuit shown in FIG. 15E.

Figure 16:
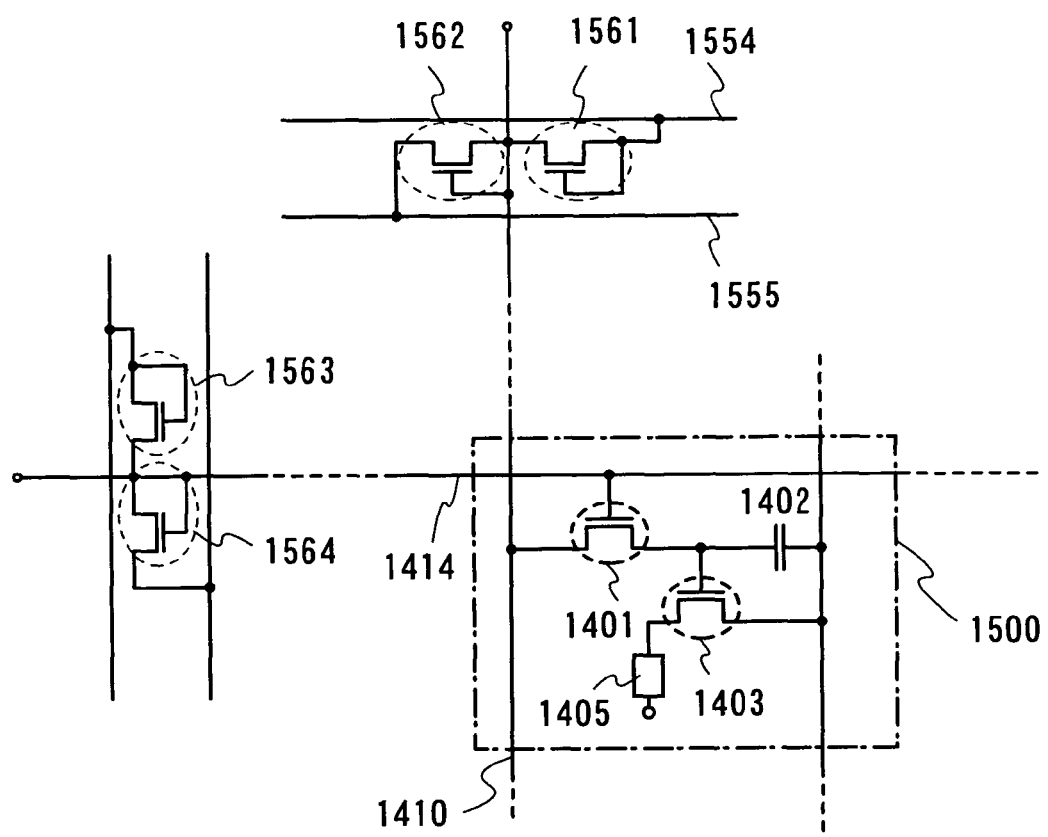
FIG. 16 is a diagram explaining a protection circuit of a pixel circuit of a light emitting device.

In FIG. 16, switching TFTs 1401 and 1403, a capacitor element 1402, and a light emitting device 1405 are provided in a pixel portion 1500. In the signal line 1410, diodes 1561 and 1562 are provided. The diodes 1561 and 1562 are manufactured in accordance with the above described embodiment mode as well as the switching TFTs 1401 and 1403. Each diode includes a gate electrode, a semiconductor layer, a source electrode, a drain electrode, and the like. By connecting the gate electrode to the drain electrode or the source electrode, the diodes 1561 and 1562 are operated.

Common potential lines 1554 and 1555 connecting to the diodes 1561 and 1562 are formed in the same layer as the gate electrodes. Therefore, it is necessary to form contact holes in a gate insulating layer so as to be in contact with the source electrodes or the drain electrodes of the diodes.

Diodes 1563 and 1564 provided in the scanning line 1414 has the similar structure.

As mentioned above, protection diodes can be simultaneously formed in an input stage according to the present invention. Further, the positions of the protection diodes are not limited thereto, and they can be provided between a driver circuit and a pixel.

A light emitting device of the present invention including such protection circuits has high reliability since it can be driven for long time. Further, the reliability of the light emitting device can be further improved by employing the above described structure.

Embodiment Mode 10

As electronic appliances having light emitting devices according to the present invention mounted with modules as shown in the above embodiment mode, a camera such as a video camera and a digital camera; a goggle type display (a head mounted display); a navigation system; an audio reproducing device (e.g., a car audio component); a computer; a game machine; a portable information terminal (e.g., a mobile computer, a mobile phone, a portable game machine, an electronic book, and the like); an image reproducing device equipped with a recording medium (concretely, a device having a display that can reproduce a recording medium such as a digital versatile disc (DVD) and can display an image thereof); and the like can be given. Specific examples of these electronic appliances are shown in FIGS. 17A to 17E, and FIGS. 18A and 18B.

Figure 17A:
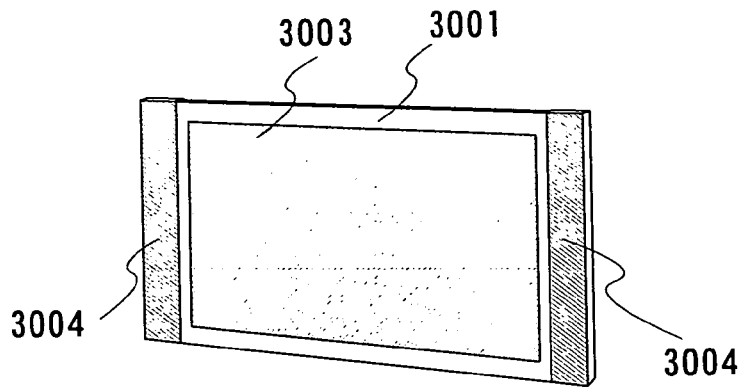
FIGS. 17A to 17E are diagrams explaining electronic appliances and the like to which light emitting devices manufactured according to the present invention are applicable.

FIG. 17A shows a monitor for a television receiver, a personal computer, or the like, including a housing 3001, a display portion 3003, speakers 3004, and the like. An active matrix display device is provided in the display portion 3003. Each pixel of the display portion 3003 includes a light emitting device formed by using the manufacturing method of the present invention and a TFT. By using the light emitting device of the present invention, a television having long light emitting life along with less deterioration in characteristics can be obtained.

Figure 17B:
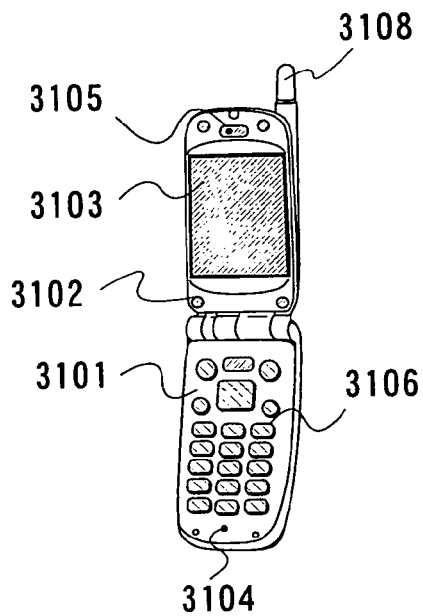

FIG. 17B shows a mobile phone, including a main body 3101, a housing 3102, a display portion 3103, an audio input portion 3104, an audio output portion 3105, operation keys 3106, an antenna 3108, and the like. An active matrix display device is provided in the display portion 3103. Each pixel of the display portion 3103 includes a light emitting device formed by using the manufacturing method of the present invention and a TFT. By using the light emitting device of the present invention, a mobile phone having long light emitting life along with less deterioration in characteristics can be obtained.

Figure 17C:
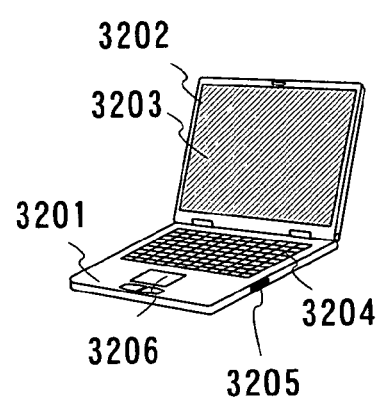

FIG. 17C shows a computer, including a main body 3201, a housing 3202, a display portion 3203, a keyboard 3204, an external connection port 3205, a pointing mouse 3206, and the like. An active matrix display device is provided in the display portion 3203. Each pixel of the display portion 3203 includes a light emitting device formed by using the manufacturing method of the present invention and a TFT. By using the light emitting device of the present invention, a computer having long light emitting life along with less deterioration in characteristics can be obtained.

Figure 17D:
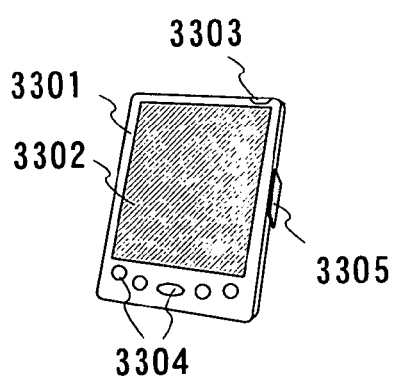

FIG. 17D shows a mobile computer, including a main body 3301, a display portion 3302, a switch 3303, operation keys 3304, an infrared port 3305, and the like. An active matrix display device is provided in the display portion 3302. Each pixel of the display portion 3302 includes a light emitting device formed by using the manufacturing method of the present invention and a TFT. By using the light emitting device of the present invention, a mobile computer having long light emitting life along with less deterioration in characteristics can be obtained.

Figure 17E:
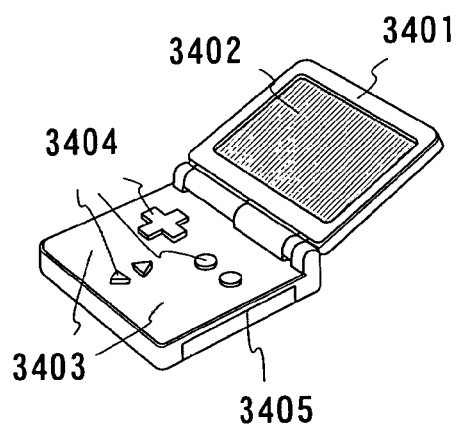

FIG. 17E shows a portable game machine, including a housing 3401, a display portion 3402, speaker portions 3403, operation keys 3404, a recording medium insert portion 3405, and the like. An active matrix display device is provided in the display portion 3402. Each pixel of the display portion 3402 includes a light emitting device formed by using the manufacturing method of the present invention and a TFT. By using the light emitting device of the present invention, a portable game machine having long light emitting life along with less deterioration in characteristics can be obtained.

Figure 18A:
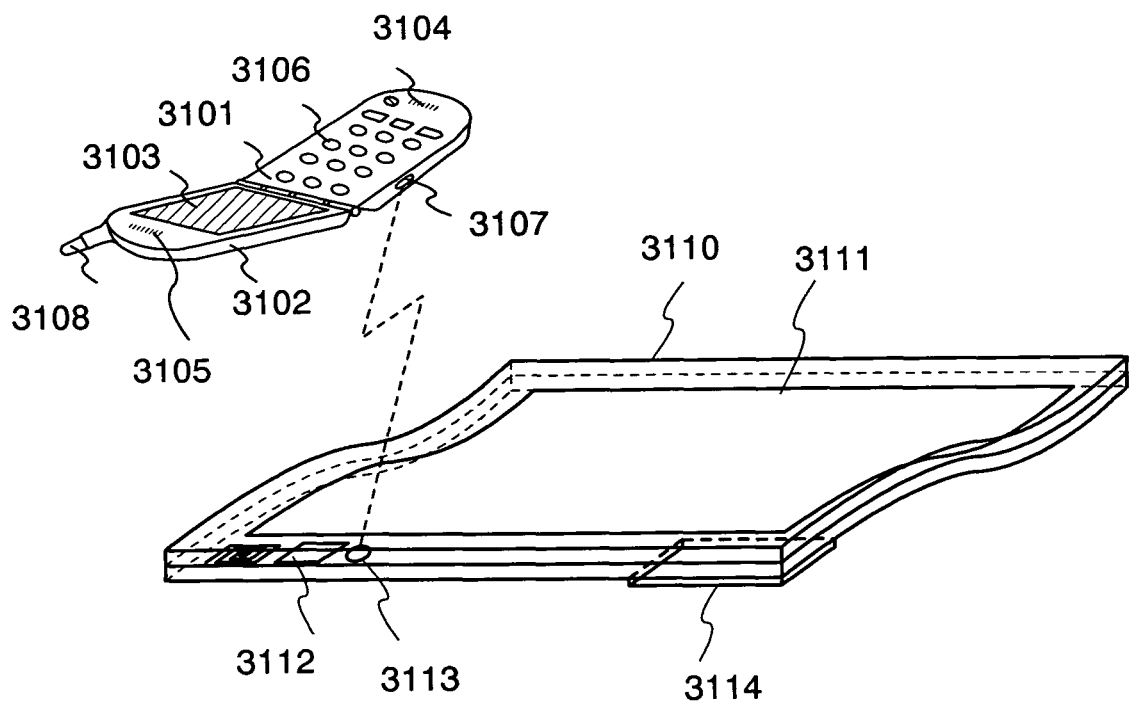
FIGS. 18A and 18B are diagrams explaining electronic appliances and the like to which light emitting devices manufactured according to the present invention are applicable.

FIG. 18A shows a flexible display, including a main body 3110, a pixel portion 3111, a driver IC 3112, a receiving apparatus 3113, a film buttery 3114, and the like. The receiving apparatus 3113 can receive a signal from an infrared communication port 3107 of the above described mobile phone. An active matrix display device is provided in the pixel portion 3111. Each pixel of the pixel portion 3111 includes a light emitting device formed by using the manufacturing method of the present invention and a TFT. By using the light emitting device of the present invention, a flexible display having long light emitting life along with less deterioration in characteristics can be obtained.

Figure 18B:
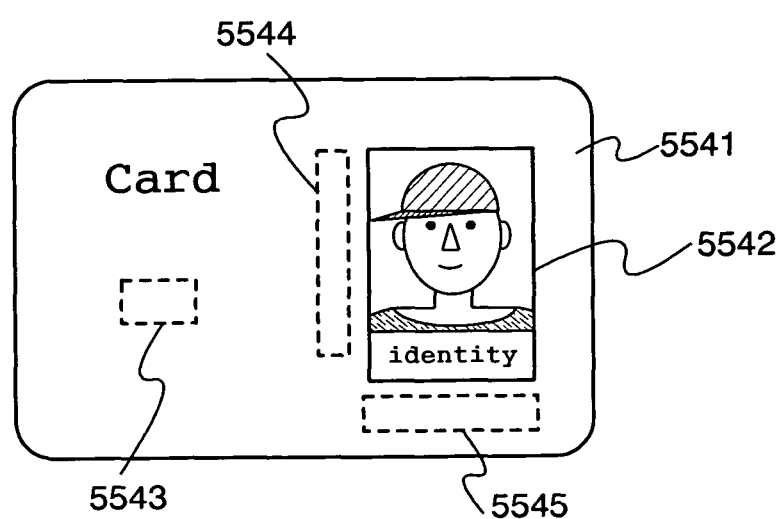

FIG. 18B shows an ID card manufactured according to the present invention, including a supporting body 5541, a display portion 5542, an integrated circuit chip 5543 incorporated in the supporting body 5541, and the like.

An active matrix display device is provided in the display portion 5542. Each pixel of the display portion 5542 includes a light emitting device formed using the manufacturing method of the present invention and a TFT. By using the light emitting device of the present invention, an ID card having long light emitting life along with less deterioration in characteristics can be obtained.

As set forth above, an application range of the present invention is extremely wide, and the present invention can be applied to electronic appliances in all fields.

[Embodiment]

Changes in luminance with time passage of a light emitting device, in which a mixed layer was formed using DNTPD as an organic compound, metal oxide as molybdenum trioxide, and rubrene, which is a substance with large steric hindrance, the mixed layer was exposed to an nitrogen atmosphere, and then a hole transporting layer, a light emitting layer, an electron transporting layer, an electron injecting layer, and a cathode were formed; and changes in luminance with time passage of a light emitting device, in which a mixed layer was not exposed to the nitrogen gas atmosphere, were measured in this embodiment.

An anode 2 was formed using ITO over a glass substrate 1, and then the glass substrate was heated under reduced pressure at 150° C. for 30 minutes (FIGS. 1A and 1B). Next, a mixed layer 3 was formed under reduced pressure to have a thickness of 120 nm by co-evaporation of DNTPD, molybdenum trioxide, and rubrene (FIG. 1C). DNTPD, molybdenum trioxide, and rubrene were mixed to satisfy DNTPD: molybdenum trioxide:rubrene=1:0.5:0.02 (mass ratio). Thereafter, the mixed layer 3 was exposed to a nitrogen gas atmosphere at a room temperature under atmospheric pressure overnight without being exposed to a gas atmosphere including oxygen (FIG. 1D). Further, the moisture content of the nitrogen gas was about 0.5 ppm.

Figure 19:
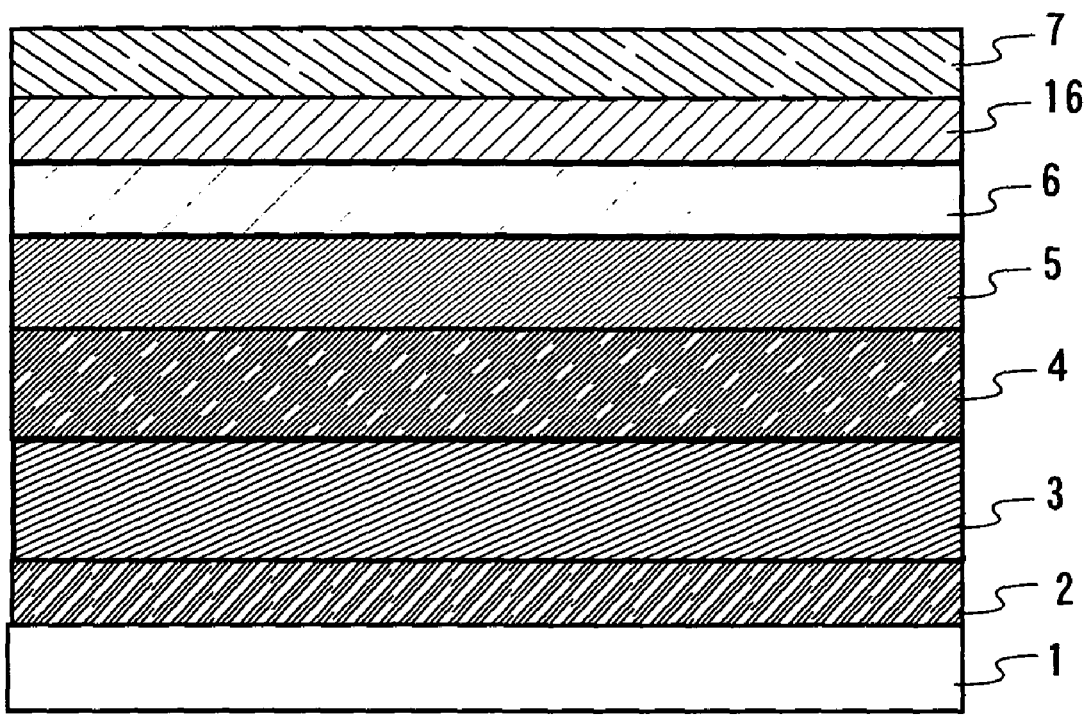
FIG. 19 is a cross sectional view explaining a method for manufacturing a light emitting device of the present invention.

Subsequently, without exposing the mixed layer 3 to a gas atmosphere including oxygen, a hole transporting layer 4 was formed using NPB by evaporation under reduced pressure to have a thickness of 10 nm (FIG. 19). A light emitting layer 5 was formed using $Alq_3$ as a host material and DMQd as a dopant material by evaporation to have a thickness of 37.5 nm (FIG. 19). A weight ratio between $Alq_3$ and DMQd was set to be 1:1.003 (=$Alq_3$:DMQd).

An electron transporting layer 6 was formed under reduced pressure using $Alq_3$ by evaporation to have a thickness of 37.5 nm. Next, an electron injecting layer 16 was formed under reduced pressure using $CaF_2$ to have a thickness of 1 nm. A cathode 7 was formed under reduced pressure using Al to have a thickness of 200 nm. Thus, a light emitting device 1 was manufactured (FIG. 19).

Meanwhile, a light emitting device 2, in which after forming a mixed layer 3, a light emitting layer, an electron transporting layer, an electron injecting layer, and a cathode were formed without exposing the mixed layer 3 to the nitrogen atmosphere, was manufactured as a comparative example. The light emitting device 2 was manufactured in the similar manner as the light emitting device 1 with the exception that the mixed layer 3 was not exposed to the nitrogen gas atmosphere.

Figure 20:
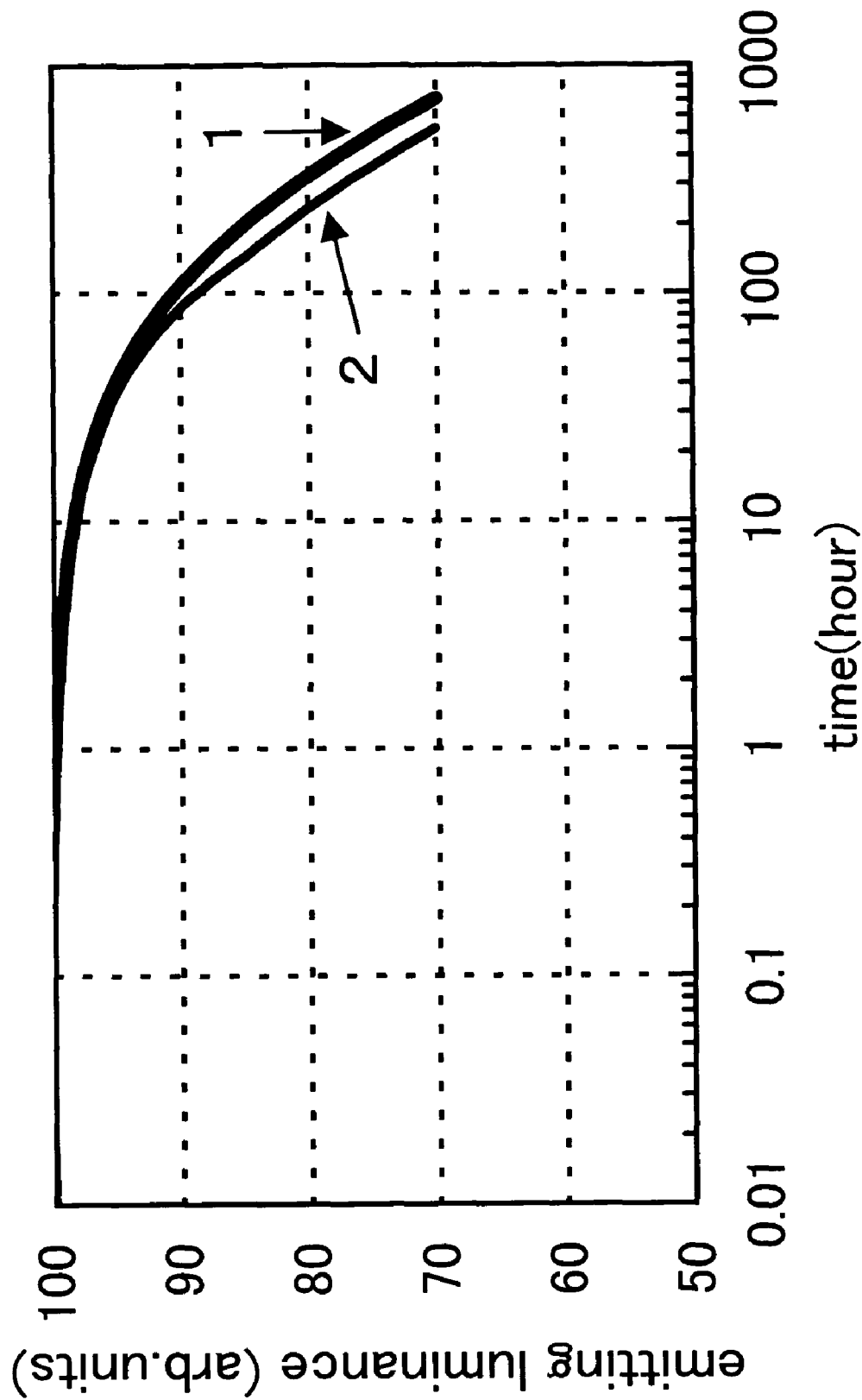
FIG. 20 is a graph explaining reliability of light emitting devices 1 and 2 of an embodiment.

FIG. 20 is a graph showing measurement results of changes in luminance with time passage of the light emitting devices 1 and 2 manufactured in this embodiment. In FIG. 20, reference numeral 1 indicates the light emitting device 1 and reference numeral 2 indicates the light emitting device 2. In FIG. 20, a horizontal axis indicates time passage (hour) whereas a vertical axis indicates light emitting luminance. The light emitting luminance was shown by a value relative to initial luminance in a case where the initial luminance was set to be 100. Note that this measurement was carried out by a method where current with a constant current density was continuously fed to each of the light emitting devices and luminance of each of the light emitting devices was measured for given time. The current density used a value when the initial luminance become 3,000 cd/m$^2$.

In a case where time when the luminance become 70 as compared with the initial luminance (100) was set to be light emitting life, it was known that the light emitting life of the light emitting device 2 was 530 hours whereas the light emitting life of the light emitting device 1 was 710 hours. Therefore, the light emitting life of the light emitting device 1 was increased by 1.3 times by exposing the mixed layer 3 to the nitrogen gas atmosphere.

This application is based on Japanese Patent Application Serial No. 2005-194559 filed in Japan Patent Office on Jul. 4, 2005, the entire contents of which are hereby incorporated by reference.

What is claimed is:

1. A method for manufacturing a light emitting device, comprising:
    forming an anode over a substrate;
    forming a mixed layer including an organic compound having an arylamine group and molybdenum oxide over the anode by co-evaporation, the mixed layer having a thickness of 60 nm or more;
    after forming the mixed layer, spraying the mixed layer with a nitrogen gas for 10 to 180 minutes in a first chamber to expose the mixed layer to a nitrogen gas atmosphere without exposing the mixed layer to a gas atmosphere including oxygen;
    after spraying the mixed layer with the nitrogen gas, transferring the substrate to a second chamber without exposing the mixed layer to a gas atmosphere including oxygen;
    forming a hole transporting layer over the mixed layer in vacuum in the second chamber without exposing the mixed layer to a gas atmosphere including oxygen;
    forming a light emitting layer over the hole transporting layer; and
    forming a cathode over the light emitting layer,
    wherein after the mixed layer is exposed to the nitrogen gas atmosphere, the nitrogen gas is evacuated, and the mixed layer is exposed to a nitrogen gas atmosphere again.

2. A method for manufacturing a light emitting device, comprising:
    forming a cathode over a substrate;
    forming an electron transporting layer over the cathode;
    forming a light emitting layer over the electron transporting layer;
    forming a hole transporting layer over the light emitting layer;
    forming a mixed layer including an organic compound having an arylamine group and molybdenum oxide over the hole transporting layer by co-evaporation, the mixed layer having a thickness of 60 nm or more;
    after forming the mixed layer, spraying the mixed layer with a nitrogen gas for 10 to 180 minutes in a first chamber to expose the mixed layer to a nitrogen gas atmosphere without exposing the mixed layer to a gas atmosphere including oxygen;
    after spraying the mixed layer with the nitrogen gas, transferring the substrate to a second chamber without exposing the mixed layer to a gas atmosphere including oxygen; and
    forming an anode over the mixed layer in vacuum in the second chamber without exposing the mixed layer to a gas atmosphere including oxygen,
    wherein after the mixed layer is exposed to the nitrogen gas atmosphere, the nitrogen gas is evacuated, and the mixed layer is exposed to a nitrogen gas atmosphere again.

3. A method for manufacturing a light emitting device according to claim 1, wherein a weight ratio between the organic compound and molybdenum oxide is set to be 95:5 to 20:80 in the mixed layer.

4. A method for manufacturing a light emitting device according to claim 2, wherein a weight ratio between the organic compound and molybdenum oxide is set to be 95:5 to 20:80 in the mixed layer.

5. A method for manufacturing a light emitting device according to claim 1, wherein the mixed layer is exposed to the nitrogen gas atmosphere at a room temperature without heating.

6. A method for manufacturing a light emitting device according to claim 2, wherein the mixed layer is exposed to the nitrogen gas atmosphere at a room temperature without heating.

7. A method for manufacturing a light emitting device according to claim 1, wherein an amount of moisture in the nitrogen gas is 40 ppm or less and the nitrogen gas is introduced in the first chamber at a flow rate of 1 to 500 sccm.

8. A method for manufacturing a light emitting device according to claim 2, wherein an amount of moisture in the nitrogen gas is 40 ppm or less and the nitrogen gas is introduced in the first chamber at a flow rate of 1 to 500 sccm.

* * * * *